(12) United States Patent
Ogura et al.

(10) Patent No.: US 12,027,453 B2
(45) Date of Patent: Jul. 2, 2024

(54) EMBEDDED SEMICONDUCTOR PACKAGES AND METHODS THEREOF

(71) Applicant: GEORGIA TECH RESEARCH CORPORATION, Atlanta, GA (US)

(72) Inventors: Nobuo Ogura, Tokyo (JP); Siddharth Ravichandran, Atlanta, GA (US); Venkatesh V. Sundaram, Atlanta, GA (US); Rao R. Tummala, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 127 days.

(21) Appl. No.: 17/433,801

(22) PCT Filed: Feb. 26, 2020

(86) PCT No.: PCT/US2020/019787
§ 371 (c)(1),
(2) Date: Aug. 25, 2021

(87) PCT Pub. No.: WO2020/176559
PCT Pub. Date: Sep. 3, 2020

(65) Prior Publication Data
US 2022/0230948 A1  Jul. 21, 2022

Related U.S. Application Data

(60) Provisional application No. 62/810,502, filed on Feb. 26, 2019.

(51) Int. Cl.
*H01L 23/495* (2006.01)
*H01L 21/48* (2006.01)
(Continued)

(52) U.S. Cl.
CPC .... *H01L 23/49822* (2013.01); *H01L 21/4803* (2013.01); *H01L 21/4857* (2013.01);
(Continued)

(58) Field of Classification Search
CPC ........... H01L 23/3107; H01L 23/49822; H01L 23/49827
(Continued)

(56) References Cited

U.S. PATENT DOCUMENTS 5,111,278 A * 5/1992 Eichelberger ....... H01L 23/5389
257/725
5,565,706 A * 10/1996 Miura ..................... H01L 24/82
257/691

(Continued)

OTHER PUBLICATIONS

International Search Report issued in International Patent Application No. PCT/US2020/19787, dated May 22, 2020, in English.
(Continued)

*Primary Examiner* — Nitin Parekh
(74) *Attorney, Agent, or Firm* — Troutman Pepper Hamilton Sanders LLP; Ryan A. Schneider; Brandon M. Reed

(57) ABSTRACT

The present disclosure describes semiconductor packages and, more particularly, chip-embedded semiconductor packages. The packages include core panels with apertures extending through the core panel. Semiconductor chips are embedded within chip apertures. A molding compound can be positioned along one side of the core panel. In some examples, the semiconductor chips are embedded within the molding compound. In other examples, the semiconductor chips are adhered to the molding compound. The coefficient of thermal expansion (CTE) values of the core panels described herein can be tailored to decrease warpage of the package as the semiconductor chip heats during use.

31 Claims, 12 Drawing Sheets

(51) Int. Cl.
  *H01L 21/56*    (2006.01)
  *H01L 23/00*    (2006.01)
  *H01L 23/31*    (2006.01)
  *H01L 23/498*   (2006.01)

(52) U.S. Cl.
  CPC .......... *H01L 21/56* (2013.01); *H01L 23/3107* (2013.01); *H01L 23/49827* (2013.01); *H01L 23/562* (2013.01)

(58) Field of Classification Search
  USPC ................................................. 257/774, 787
  See application file for complete search history.

(56) References Cited

U.S. PATENT DOCUMENTS

| | | | |
|---|---|---|---|
| 5,703,400 A * | 12/1997 | Wojnarowski .......... | H01L 24/82 257/E25.011 |
| 6,506,632 B1 * | 1/2003 | Cheng ................. | H01L 21/6835 438/126 |
| 6,512,176 B2 * | 1/2003 | Yaguchi ................. | H01L 23/16 257/668 |
| 6,590,291 B2 * | 7/2003 | Akagawa ................ | H01L 24/82 257/784 |
| 8,004,095 B2 * | 8/2011 | Shim, II ................ | H01L 23/481 257/774 |
| 2006/0049530 A1 * | 3/2006 | Hsu ........................ | H01L 25/50 257/E21.705 |
| 2006/0145328 A1 | 7/2006 | Hsu | |
| 2008/0006936 A1 * | 1/2008 | Hsu ........................ | H01L 24/24 257/731 |
| 2008/0165515 A1 | 7/2008 | Hsu et al. | |
| 2009/0008793 A1 * | 1/2009 | Pohl ........................ | H01L 24/82 438/109 |
| 2013/0249101 A1 | 9/2013 | Lin et al. | |
| 2017/0084530 A1 | 3/2017 | Lin et al. | |
| 2017/0243857 A1 | 8/2017 | Hwang et al. | |
| 2018/0076175 A1 | 3/2018 | Hsieh et al. | |
| 2019/0189572 A1 * | 6/2019 | Chiang ............... | H01L 23/5226 |

OTHER PUBLICATIONS

Written Opinion of the International Searching Authority issued in International Patent Application No. PCT/US2020/19787, dated May 22, 2020, in English.

International Preliminary Report on Patentability issued in International Patent Application No. PCT/US2020/19787, dated Aug. 25, 2021, in English.

* cited by examiner

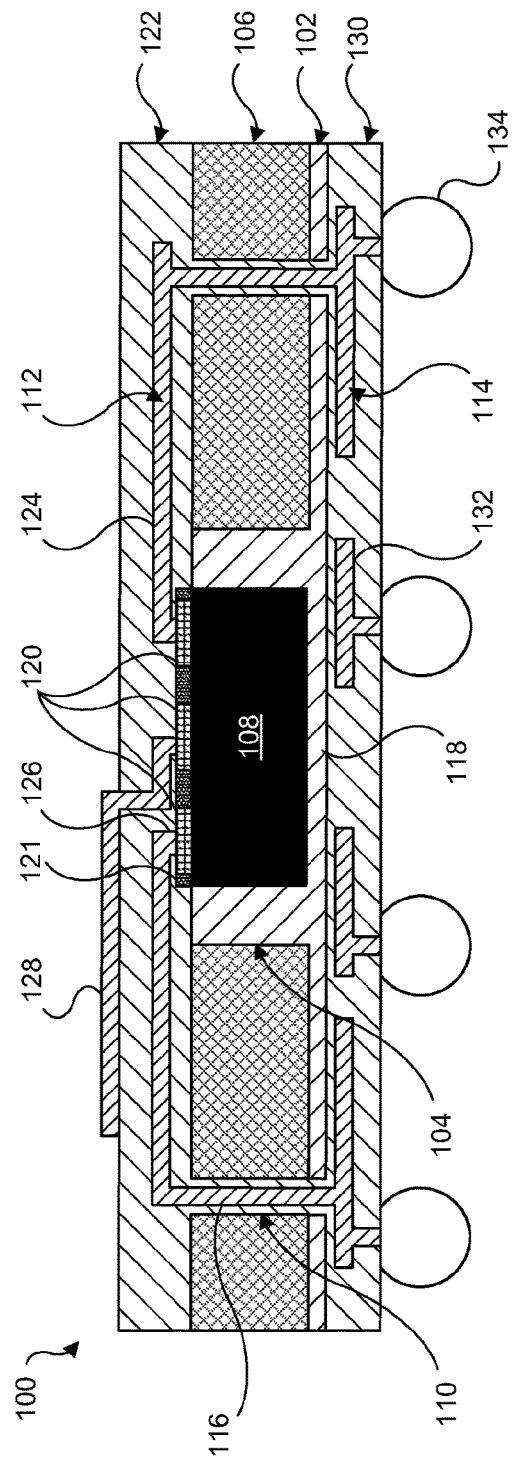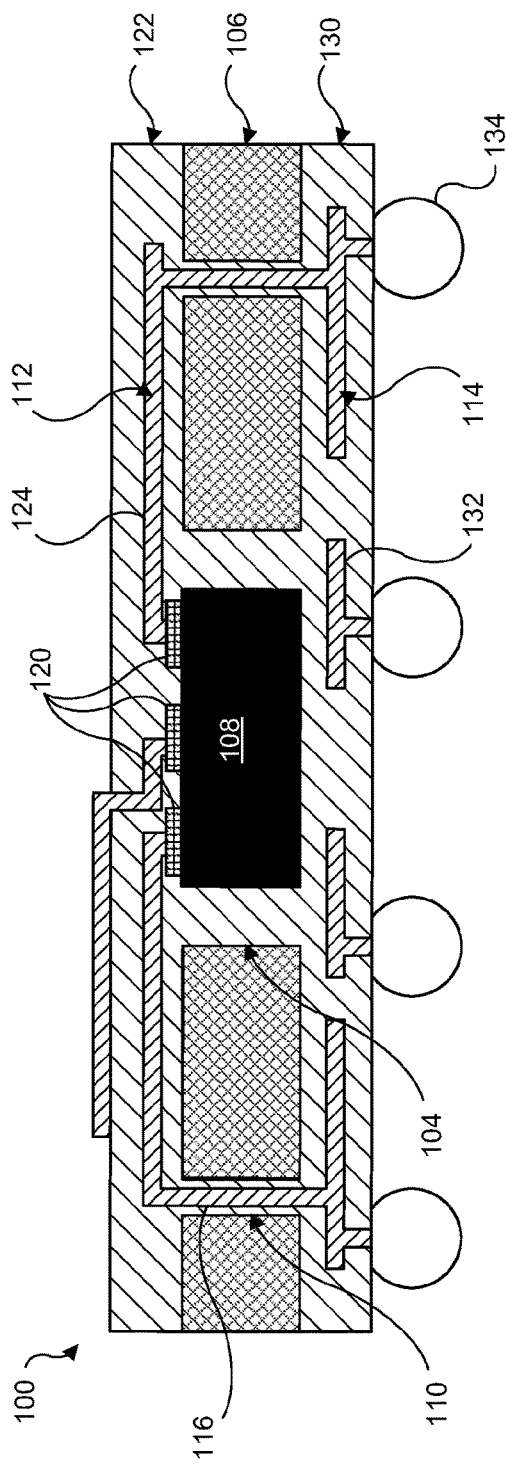

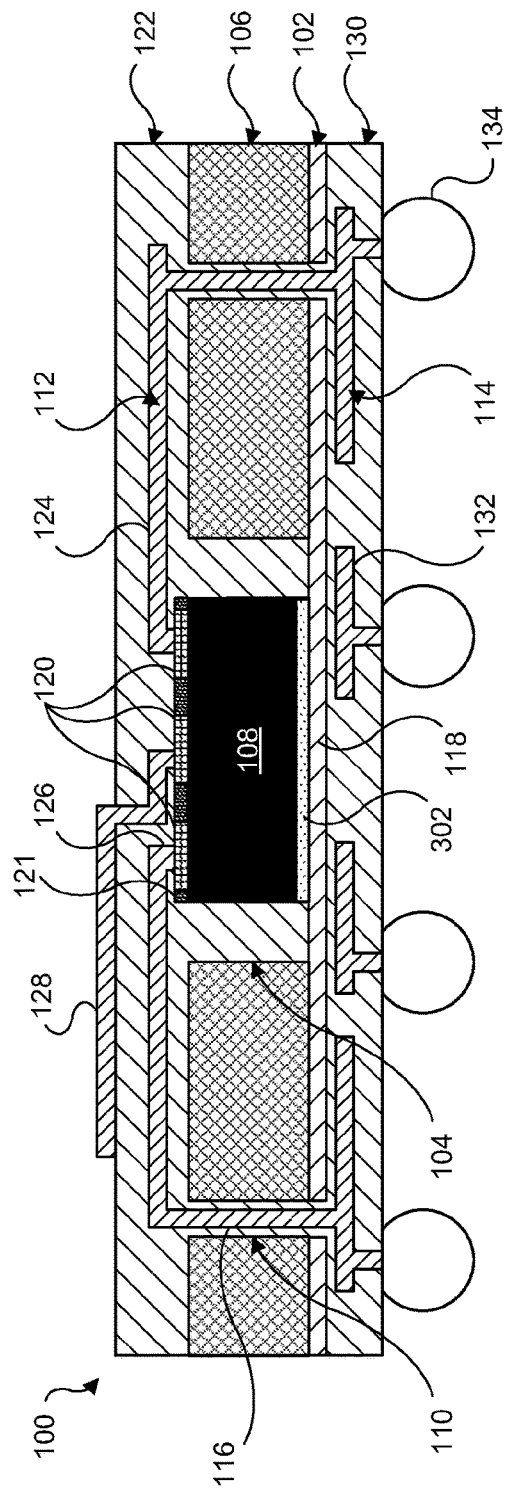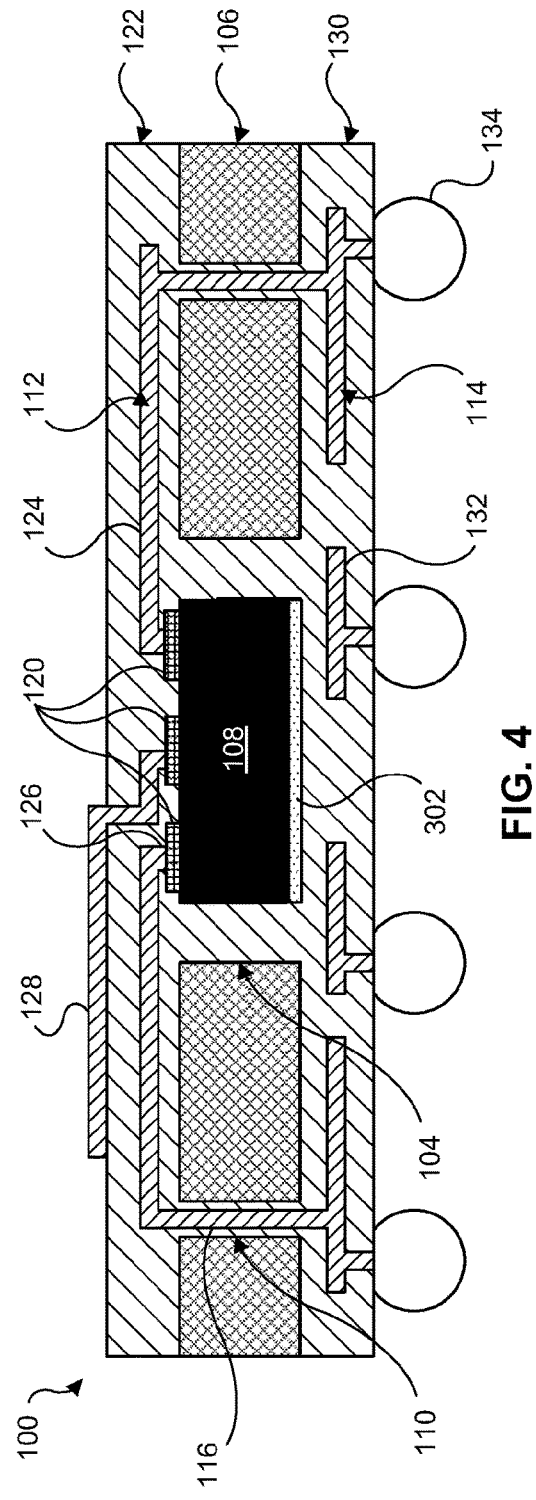

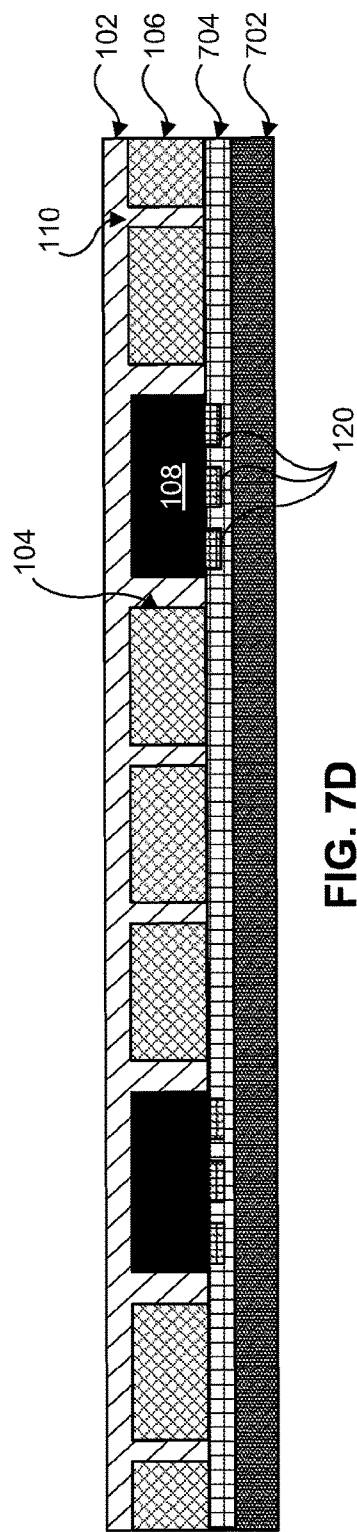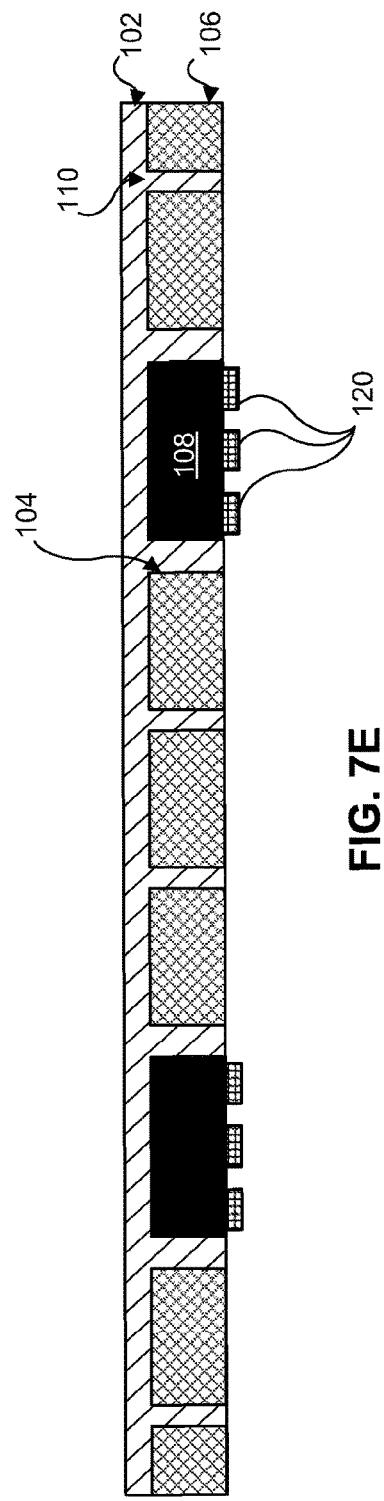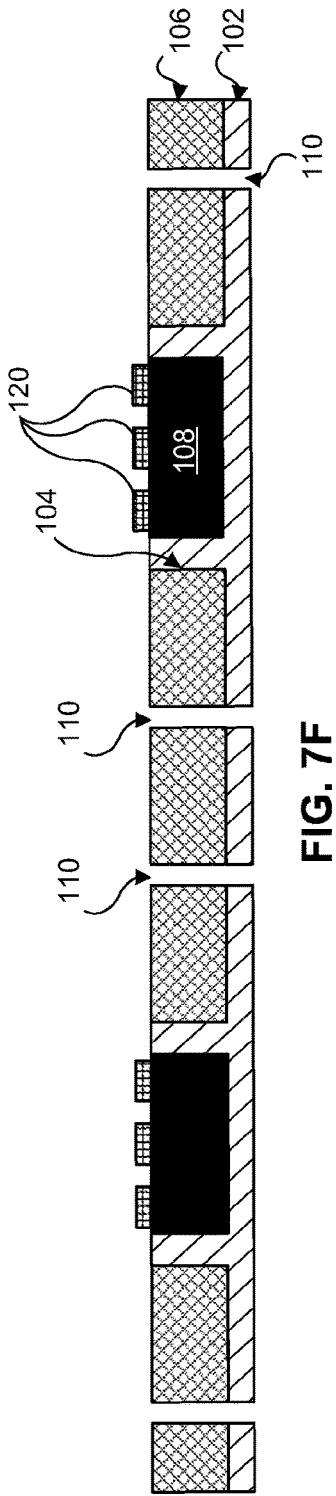

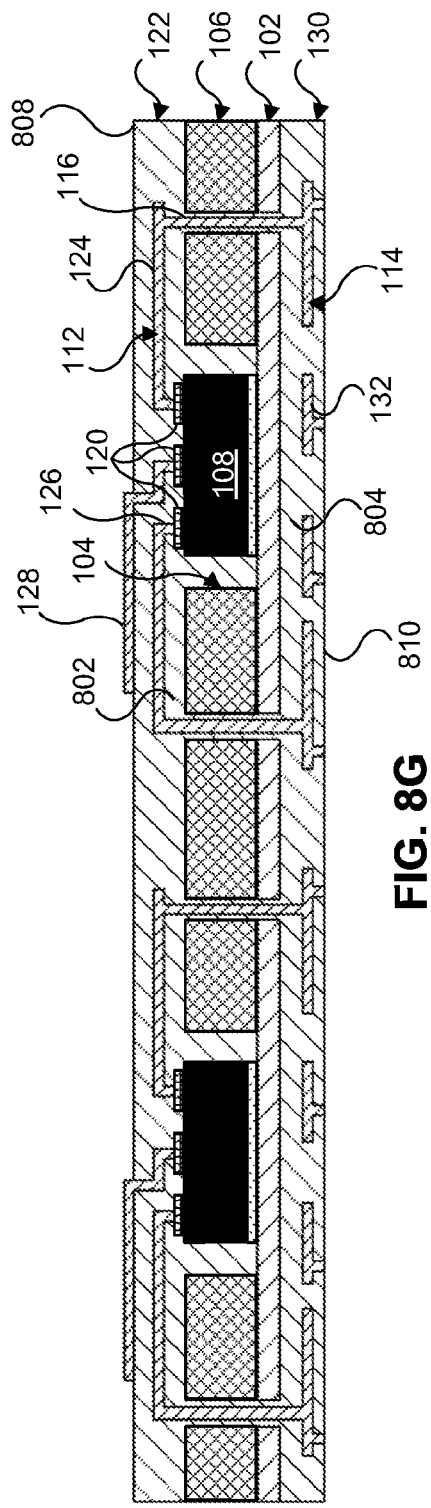
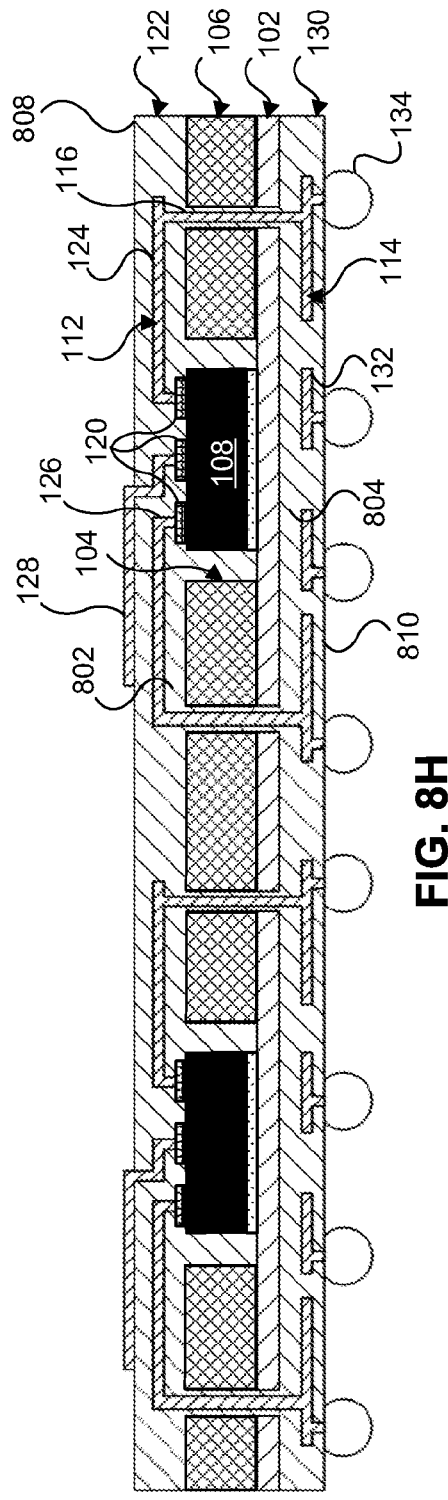
FIG. 8G
FIG. 8H

EMBEDDED SEMICONDUCTOR PACKAGES AND METHODS THEREOF

CROSS-REFERENCE TO RELATED APPLICATIONS

This application claims priority, and benefit under 35 U.S.C. § 119(e), to U.S. Provisional Patent Application No. 62/810,502, filed 26 Feb. 2019, the entire contents of which is hereby incorporated by reference as if fully set forth below.

FIELD OF THE DISCLOSURE

Embodiments of the present disclosure relate generally to semiconductor packages and, more particularly, to chip-embedded semiconductor packages.

BACKGROUND

In recent years, the demand for smaller, more powerful computing devices has spurred interest in developing high-performance semiconductor packages with high-density redistribution layers and support for back-end-of-line-like input/output (I/O) pitches. One must only consider a mobile device, with its high number of I/O applications, to understand the growth of interest in the field of small-form, high-power semiconductor packages. The most common approach to address these needs today is the 2.5D silicon interposer. The 2.5D silicon interposer provides a first layer to house one or more semiconductor chips and a second layer, a redistribution layer (RDL), to "fan" the connections of the one or more semiconductor chips to various I/O applications. These architectures become very expensive as the package size increases. Recently, Embedded Si-Interconnect Bridge and RDL-first approaches have been demonstrated as cost-effective architectures for scaling to larger packages. However, these architectures, just like silicon interposers, are bump limited and are hence prone to slow-throughput assemblies.

Even more recently, wafer-level-fan-out (WLFO) packages have grown in popularity, as the architecture allows scaling to very fine I/O pitches, enabling unparalleled power and signal performance. Most of today's WLFO packages comprise an epoxy-based molding layer to connect the various components. These epoxy-based WLFO packages can, however, also have limitations with respect to scaling up the size and density of I/O applications. First, a large mismatch exists between the coefficient of thermal expansion (CTE) of the silicon die and the other components within the package. In a single package, for example, a silicon die can have a CTE of around 3 ppm/° C., the molding compound can have a CTE of 10-12 ppm/° C., and the printable circuit board (PCB) on which the package is attached can have a CTE of from 17-18 ppm/° C. The difference in the thermal expansion between the chip, molding compound, and printable circuit board can cause significant warpage of the molding compound layer as the device heats up while in use.

This warpage creates a second significant limitation with current epoxy-based WLFO packages: to counteract the warpage, current packages are limited in size and thus number of I/O applications. Current epoxy-based WLFO packages can be limited, for example, to small footprints of around 15×15 mm. But with current demands, and future demands such as integrating 5G capabilities, much larger packages (e.g., greater than 50×50 mm) are desired. Finally, current epoxy-based WLFO packages are also prone to die-shift, or movement of the semiconductor from its intended position within the package, which is primarily caused by the epoxy mold shrinking during processing.

What is needed, therefore, is a semiconductor package architecture that provides the benefits of epoxy-based WLFO packages, including the high I/O density, but avoids the problems associated with warpage, limited footprint, and die shift.

SUMMARY

Embodiments of the present disclosure address these concerns as well as other needs that will become apparent upon reading the description below in conjunction with the drawings. Briefly described, embodiments of the present disclosure relate generally to semiconductor packages and, more particularly, to chip-embedded semiconductor packages.

An exemplary embodiment of the present invention provides an embedded semiconductor package. The embedded semiconductor package can include a core panel having a first side and a second side. The core panel can include a chip aperture extending from the first side to the second side of the core panel. The embedded semiconductor package can include a molding compound layer having a first side and a second side, the first side proximate the first side of the core panel and extending at least partially into the chip aperture. The embedded semiconductor package can include a first semiconductor chip disposed in the chip aperture and at least partially within the molding compound layer. The first semiconductor chip can have a first side proximate the molding compound layer and a second side opposite the molding compound layer and proximate the second side of the core panel. The second side of the first semiconductor chip can have an electrode. The embedded semiconductor package can include a first dielectric layer positioned proximate the second side of the core panel and proximate the electrode. The embedded semiconductor package can include a first redistribution layer disposed within the first dielectric layer and in electrical communication with the electrode. The embedded semiconductor package can include a second dielectric layer positioned proximate to and in contact with the second side of the molding compound layer. The embedded semiconductor package can include a second redistribution layer disposed within the second dielectric layer and in electrical communication with the first redistribution layer.

In any embodiment described herein, the embedded semiconductor package can include a conductive material having a first end in electrical communication with the first redistribution layer and a second end in electrical communication with the second redistribution layer. The core panel can include a second aperture, e.g., a through aperture, extending from the first side to the second side of the core panel. The conductive material can extend through the second aperture.

In any embodiment described herein, the core panel can comprise glass.

In any embodiment described herein, the glass can have a coefficient of thermal expansion of approximately 3 ppm/° C.

In any embodiment described herein, the glass can have a coefficient of thermal expansion of from approximately 3 ppm/° C. to approximately 7 ppm/° C.

In any embodiment described herein, the glass can have a coefficient of thermal expansion of from approximately 7 ppm/° C. to approximately 10 ppm/° C.

In any embodiment described herein, the glass can have a coefficient of thermal expansion of greater than 10 ppm/° C.

In any embodiment described herein, the core panel can comprise at least one of an organic laminate material or an inorganic laminate material.

In any embodiment described herein, the core panel can comprise at least one of quartz or a metallic material.

In any embodiment described herein, the core panel can include a third aperture extending from the first side to the second side of the core panel. The embedded semiconductor package can include a second semiconductor chip disposed in the third aperture and at least partially within the molding compound layer. The second semiconductor chip can have a first side proximate the molding compound layer and a second side opposite the molding compound layer and proximate the second side of the core panel. The second side of the second semiconductor chip can have an electrode.

In any embodiment described herein, the core panel can have a thickness of less than 100 μm.

In any embodiment described herein, the first semiconductor chip can remain uncovered by the core panel. For example, the core panel may not extend over the first semiconductor chip. In any embodiment described herein, the semiconductor package may not include an additional core panel parallel to the core panel, such that no additional core panel extends over the first semiconductor chip.

Another exemplary embodiment of the present invention provides an embedded semiconductor package. The embedded semiconductor package can include a core panel having a first side and a second side. The core panel can have a chip aperture extending from the first side to the second side of the core panel. The embedded semiconductor package can include a molding compound layer having a first side and a second side, the first side proximate the first side of the core panel and not extending into the chip aperture. The embedded semiconductor package can include a first semiconductor chip disposed in the chip aperture. The first semiconductor chip can have a first side proximate the molding compound layer and a second side opposite the molding compound layer and proximate the second side of the core panel. The second side of the first semiconductor chip can have an electrode. The embedded semiconductor package can include a first dielectric layer positioned proximate the second side of the core panel and proximate the electrode. The embedded semiconductor package can include a first redistribution layer disposed within the first dielectric layer and in electrical communication with the electrode. The embedded semiconductor package can include a second dielectric layer positioned proximate to and in contact with the second side of the molding compound layer. The embedded semiconductor package can include a second redistribution layer disposed within the second dielectric layer and in electrical communication with the first redistribution layer.

In any embodiment described herein, the first side of the first semiconductor chip can be at least partially embedded into the first side of the molding compound layer.

In any embodiment described herein, the first side of the first semiconductor chip can be laminated to the first side of the molding compound layer via an adhesive.

In any embodiment described herein, the adhesive can be a die attach film.

In any embodiment described herein, the embedded semiconductor package can include a conductive material having a first end in electrical communication with the first redistribution layer and a second end in electrical communication with the second redistribution layer. The core panel can include a second aperture extending from the first side to the second side of the core panel. The conductive material can extend through the second aperture.

In any embodiment described herein, the core panel can comprise glass.

In any embodiment described herein, the glass can have a coefficient of thermal expansion of approximately 3 ppm/° C.

In any embodiment described herein, the glass can have a coefficient of thermal expansion of from approximately 3 ppm/° C. to approximately 7 ppm/° C.

In any embodiment described herein, the glass can have a coefficient of thermal expansion of from approximately 7 ppm/° C. to approximately 10 ppm/° C.

In any embodiment described herein, the glass can have a coefficient of thermal expansion of greater than 10 ppm/° C.

In any embodiment described herein, the core panel can comprise at least one of an organic laminate material or an inorganic laminate material.

In any embodiment described herein, the core panel can comprise at least one of quartz or a metallic material.

In any embodiment described herein, the core panel can include a third aperture extending from the first side to the second side of the core panel. The embedded semiconductor package can include a second semiconductor chip disposed in the third aperture. The second semiconductor chip can have a first side proximate the molding compound layer and a second side opposite the molding compound layer and proximate the second side of the core panel. The second side of the second semiconductor chip can have an electrode.

In any embodiment described herein, the first side of the second semiconductor chip can be at least partially embedded into the first side of the molding compound layer.

In any embodiment described herein, the first side of the second semiconductor chip can be laminated to the first side of the molding compound layer via an adhesive.

In any embodiment described herein, the core panel can have a thickness of less than 100 μm.

In any embodiment described herein, the first semiconductor chip can remain uncovered by the core panel. For example, the core panel may not extend over the first semiconductor chip. In any embodiment described herein, the semiconductor package may not include an additional core panel parallel to the core panel, such that no additional core panel extends over the first semiconductor chip.

Another exemplary embodiment of the present invention provides a method of manufacturing an embedded semiconductor package. The method can include preparing a core panel having a first side and a second side. The core panel can include a chip aperture extending from the first side to the second side of the core panel. The method can include attaching the first side of the core panel to a carrier layer with an adhesive. The method can include placing a first semiconductor chip into the chip aperture. The first semiconductor chip can include an electrode proximate the carrier layer. The method can include applying a molding compound to the second side of the core panel, wherein the molding compound covers the second side of the core panel to form a molding compound layer. The molding compound can extend into the chip aperture to at least partially encapsulate the first semiconductor chip. The method can include curing the molding compound. The method can include removing the carrier layer and adhesive from the first side of the core panel. The method can include applying a first layer of dielectric material to the first side of the core panel. The method can include applying a second layer of dielectric material to the molding compound layer. The method can include creating a second aperture in the core panel and the molding compound layer. The second aperture can extend from the first layer of dielectric material to the second layer of dielectric material. The method can include metalizing a wall of the second aperture to form a via. The method can include forming a first redistribution layer on the first layer of dielectric material. The first redistribution layer can be in electrical communication with the electrode and with a first end of the metalized wall. The method can include forming a second redistribution layer on the second layer of dielectric material, the second redistribution layer in electrical communication with a second end of the metalized wall.

In any embodiment described herein, the method can include applying a third layer of dielectric material to cover the first redistribution layer. The method can include applying a fourth layer of dielectric material to cover the second redistribution layer.

In any embodiment described herein, curing the molding compound can include curing the molding compound at a first temperature and then curing the molding compound at a second temperature. The first temperature can be lower than the second temperature.

In any embodiment described herein, the core panel can comprise glass.

In any embodiment described herein, the glass can have a coefficient of thermal expansion of approximately 3 ppm/° C.

In any embodiment described herein, the glass can have a coefficient of thermal expansion of from approximately 3 ppm/° C. to approximately 7 ppm/° C.

In any embodiment described herein, the glass can have a coefficient of thermal expansion of from approximately 7 ppm/° C. to approximately 10 ppm/° C.

In any embodiment described herein, the glass can have a coefficient of thermal expansion of greater than 10 ppm/° C.

In any embodiment described herein, the core panel can comprise at least one of an organic laminate material or an inorganic laminate material.

In any embodiment described herein, the core panel can comprise at least one of quartz or a metallic material.

In any embodiment described herein, the core panel can include a third aperture extending from the first side to the second side of the core panel. The method can include placing a second semiconductor chip into the third aperture. The second semiconductor chip can include an electrode proximate the carrier layer.

In any embodiment described herein, the core panel can have a thickness of less than 100 μm.

In any embodiment described herein, the first semiconductor chip can remain uncovered by the core panel. For example, the core panel may not extend over the first semiconductor chip. In any embodiment described herein, the semiconductor package may not include an additional core panel parallel to the core panel, such that no additional core panel extends over the first semiconductor chip.

Another exemplary embodiment of the present invention provides a method of manufacturing an embedded semiconductor package. The method can include preparing a core panel having a first side and a second side. The core panel can include a chip aperture extending from the first side to the second side of the core panel. The method can include preparing a layer of molding compound, thereby forming a molding compound layer. The method can include placing the first side of the core panel on the molding compound layer. The method can include curing the molding compound. The method can include placing a first semiconductor chip into the chip aperture. The first semiconductor chip can have a first side and a second side, the second side can include an electrode. The method can include adhering the first side of the first semiconductor chip to the molding compound layer. The method can include applying a first layer of dielectric material to the second side of the core panel. The method can include applying a second layer of dielectric material to the molding compound layer. The method can include creating a second aperture in the core panel and the molding compound layer. The second aperture can extend from the first layer of dielectric material to the second layer of dielectric material. The method can include metalizing a wall of the second aperture to form a via. The method can include forming a first redistribution layer on the first layer of dielectric material. The first redistribution layer can be electrical communication with the electrode and with a first end of the metalized wall. The method can include forming a second redistribution layer on the second layer of dielectric material. The second redistribution layer can be in electrical communication with a second end of the metalized wall.

In any embodiment described herein, adhering the first side of the first semiconductor chip to the molding layer can include placing a die attach film between the first side of the first semiconductor chip and the molding layer.

In any embodiment described herein, the method can include applying a third layer of dielectric material to cover the first redistribution layer. The method can include applying a fourth layer of dielectric material to cover the second redistribution layer.

In any embodiment described herein, curing the molding compound can include curing the molding compound at a first temperature and then curing the molding compound at a second temperature. The first temperature can be lower than the second temperature.

In any embodiment described herein, the core panel can comprise glass.

In any embodiment described herein, the glass can have a coefficient of thermal expansion of approximately 3 ppm/° C.

In any embodiment described herein, the glass can have a coefficient of thermal expansion of from approximately 3 ppm/° C. to approximately 7 ppm/° C.

In any embodiment described herein, the glass can have a coefficient of thermal expansion of from approximately 7 ppm/° C. to approximately 10 ppm/° C.

In any embodiment described herein, the glass can have a coefficient of thermal expansion of greater than 10 ppm/° C.

In any embodiment described herein, the core panel can comprise at least one of an organic laminate material or an inorganic laminate material.

In any embodiment described herein, the core panel can comprise at least one of quartz or a metallic material.

In any embodiment described herein, the core panel can include a third aperture extending from the first side to the second side of the core panel. The method can include placing a second semiconductor chip into the third aperture, the second semiconductor chip having a first side and a second side, and the second side can include an electrode. The method can include adhering the first side of the second semiconductor chip to the molding compound layer.

In any embodiment described herein, adhering the first side of the second semiconductor chip to the molding layer can include placing a die attach film between the first side of the second semiconductor chip and the molding layer.

In any embodiment described herein, the core panel can have a thickness of less than 100 µm.

In any embodiment described herein, the first semiconductor chip can remain uncovered by the core panel. For example, the core panel may not extend over the first semiconductor chip. In any embodiment described herein, the semiconductor package may not include an additional core panel parallel to the core panel, such that no additional core panel extends over the first semiconductor chip.

These and other aspects of the present invention are described in the Detailed Description below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE FIGURES

Reference will now be made to the accompanying figures and diagrams, which are not necessarily drawn to scale, and wherein:

FIG. 1 is a schematic cross sectional view of an embedded semiconductor package with a molding compound layer extending into a chip aperture, according to some embodiments of the present disclosure;

FIG. 2 is a schematic cross sectional view of an embedded semiconductor package without a molding compound layer, according to some embodiments of the present disclosure;

FIG. 3 is a schematic cross sectional view of an embedded semiconductor package with a semiconductor chip adhered to a planar molding compound layer, according to some embodiments of the present disclosure;

FIG. 4 is a schematic cross sectional view of an embedded semiconductor package without a molding compound layer, according to some embodiments of the present disclosure;

FIGS. 7A-7K depict an exemplary process for manufacturing an embedded semiconductor package, according to some embodiments of the present disclosure;

FIGS. 8A-8H depict an exemplary process for manufacturing an embedded semiconductor package, according to some embodiments of the present disclosure;

DETAILED DESCRIPTION

Figure 5:
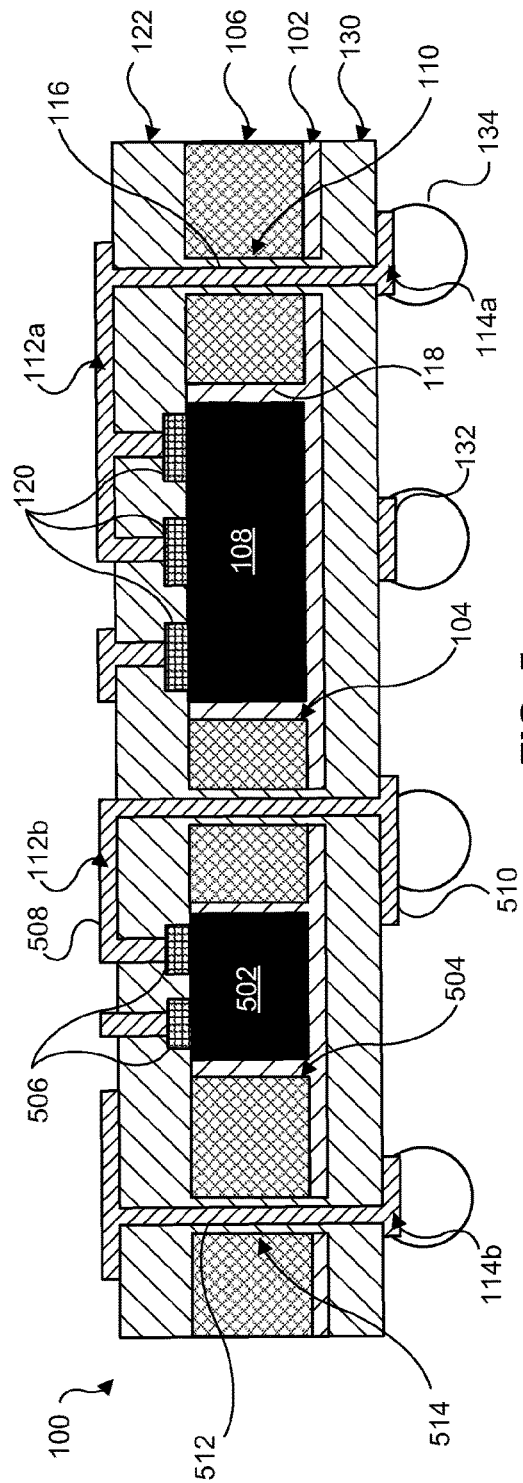
FIG. 5 is a schematic cross sectional view of an embedded semiconductor package with a plurality of semiconductor chips, according to some embodiments of the present disclosure.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

It should also be noted that, as used in the specification and the appended claims, the singular forms "a," "an," and "the" include plural references unless the context clearly dictates otherwise. References to a composition containing "a" constituent is intended to include other constituents in addition to the one named.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter. Additionally, the components described herein may apply to any other component within the disclosure. Merely discussing a feature or component in relation to one embodiment does not preclude the feature or component from being used or associated with another embodiment.

To facilitate an understanding of the principles and features of the disclosure, various illustrative embodiments are explained below. In particular, the presently disclosed subject matter is described in the context of semiconductor packages and, in particular, semiconductor packages comprising a panel layer and embedded semiconductor chips. The present disclosure, however, is not so limited and can be applicable in other contexts. For example, some examples of the present disclosure may improve the manufacture of other micro-scale electronics devices. It will also be understood that many examples described herein include a molding compound layer, but it is contemplated that the packages are manufactured without molding compound. For example, and not limitation, the semiconductor chips described herein can be encapsulated within and/or adhered to a layer of dielectric material. These embodiments are contemplated within the scope of the present disclosure. Accordingly, when the present disclosure is described in the context of semiconductor packages comprising a panel layer, semiconductor chips embedded within the panel layer, and molding compound layers, it will be understood that other embodiments can take the place of those referred to.

As stated above, recent trends in semiconductor packages include packaging chips and wired connections together in a wafer-level-fan-out (WLFO) package. These WLFO packages ordinarily include a chip embedded within an epoxy mold, and a redistribution layer (RDL) of copper connections is positioned within the mold. At one end of the RDL is a connection to electrodes of the chip, and at the other end of the RDL is a plurality of input/output (I/O) connections. For example, the second end of the RDL can be connected to I/O devices or a printable circuit board (PCB). This layered RDL design increases the I/O densities for semiconductor packages, but the mold-compound architecture is also limited with respect to scaling up to large-form packages. Mold-compound-induced die shift is one significant problem associated with current WLFO packages. The mold compound also experiences significant warpage due to the processing of the compound layer. Another significant problem is the coefficient of thermal expansion (CTE) mismatch between the mold compound and the semiconductor chips that are embedded within the compound. The CTE of a silicon die, for example, can be as low as 3 ppm/° C., while the molding compound used in many of today's semiconductor packages can have a CTE of greater than 10 ppm/° C. As the die heats up, as is expected and is only exacerbated as more processing power is expected of the chip, the molding around the die will expand more than the chip, placing a significant amount of stress on the chip.

The CTE mismatch can also further increase the warpage described above, which can hinder panel-scale processing. As a result, it is difficult to use current WLFO technology for large packages (e.g., greater than 40×40 mm) in high-bandwidth computing. The present disclosure provides solutions to the problems associated with WLFO architectures. The present inventions can provide a platform to integrate heterogeneous ICs at package level with the same density as if they were integrated on a single chip using back-end-of-line (BEOL) wiring, but with improved performance, power efficiency, and cost.

In various embodiments of the present disclosure, an embedded semiconductor package can include multiple layers to house the various components of the package. An embedded semiconductor package can include a core panel comprising a plurality of apertures extending through the core panel. Some of the apertures can house one or more semiconductor chips, while other apertures can serve as through-panel or through-mold vias to connect an RDL on top of the package to an RDL on the bottom of the package. Throughout this disclosure, the term "embedded" can refer to embedding the one or more semiconductor chips within an aperture of the core panel. In some examples, a molding compound layer can be provided along the surface of the core panel. In some examples, the molding compound can extend into an aperture to encapsulate the semiconductor chip. The semiconductor chip can be laminated to the molding compound layer via an adhesive. The embedded semiconductor package can also include layers of dielectric material in which the RDLs may be embedded or placed upon.

The present disclosure also describes exemplary methods to manufacture certain embodiments of the present inventions. As described above, epoxy-mold designs have inherent limitations that inhibits their use in large-scale applications. The manufacturing process can cause many of these inherent limitations. For example, die shift can be caused by filling molds with epoxy, which can then shrink during or after processing. Some approaches to alleviate the warpage problem include using multiple different epoxy materials to encapsulate the semiconductor chip. This can include using one material around the die and another material in the body of the package. This approach, however, increases the complexity and scalability of the manufacturing process. The present disclosure, instead, describes methods to decrease die shift and warpage by using CTE-tailorable embedded panels, and the designs allow for the use of a single epoxy compound. Though more than one epoxy compound can be used in the packages described herein, the packages do not rely upon a plurality of epoxy compounds to solve the warpage and die-shift problems.

Various devices and methods are disclosed for providing an embedded semiconductor package, and exemplary embodiments of the devices and methods will now be described with reference to the accompanying figures.

FIG. 1 is a schematic cross sectional view of an embedded semiconductor package 100 with a molding compound layer 102 extending into a chip aperture 104, according to some embodiments of the present disclosure. An embedded semiconductor package 100 can include a core panel 106. The core panel 106 can be used to create the inner scaffold of the semiconductor package. A core panel 106 can be thin sheet of material. For example, the thickness of the core panel 106 can be less than 1.00 mm (e.g., from 10 µm to 50 µm; from 50 µm to 100 µm; from 100 µm to 300 µm; from 300 µm to 500 µm; from 500 µm to 700 µm; or from 500 µm to 1.0 mm), and this material can provide the support and rigidity for the package.

One or more apertures can be created in the core panel 106 to house the components of the package. For example, a chip aperture 104 can be disposed in the core panel 106, and the chip aperture 104 can extend from one side of the core panel 106 to the other. A semiconductor chip 108 can be disposed within the chip aperture 104. Additional apertures can be created in the core panel 106, including a through aperture 110 (i.e., a through-panel via), to connect a first RDL 112 to a second RDL 114, for example by metalizing the wall of the through aperture 110 to create a via 116. A core panel 106 can have any number of apertures 104,110 such that the panel can house any number of semiconductor chips 108 or provide any number of vias 116. A via 116 can be a conductive material that extends through the core panel 106 to connect the first RDL 112 to the second RDL 114.

Adjacent to at least one side of the core panel 106 can be a molding compound layer 102 comprising a molding compound 118. The molding compound 118 can comprise an epoxy molding. In some examples, and as shown in FIG. 1, the molding compound 118 and molding compound layer 102 can extend at least partially into the chip aperture 104. In these examples, the molding compound 118 can encapsulate at least a portion of the semiconductor chip 108. A semiconductor chip 108 can include one or more electrodes 120 for attachment of electrical components (e.g., I/O components). In some examples, one side of the semiconductor chip 108 can include the electrode 120, while the other side of the semiconductor chip 108 does not include an electrode. In these examples, the side of the semiconductor chip 108 without an electrode can be proximate the molding compound layer 102; the electrode 120 can be facing away from the molding compound layer 102.

In some examples, the embedded semiconductor package 100 can include a passivation layer 121 at the location of the one or more electrodes 120. The passivation layer 121 can be, for example, a surface passivation to improve the performance of the semiconductor chip 108, decrease corrosion at the site of the electrodes 120, and the like. The passivation layer 121 can include silicon nitride (SiN), silicon dioxide (SiO2), polyimide and the like. For completeness, it will be understood that any embodiment described herein, including those shown in FIGS. 2-6 or the method steps in FIGS. 7A-8H, can include a passivation layer 121. In some examples shown in this disclosure, the passivation layer 121 may be excluded from the figures to provide a better view of the redistribution layers, for example.

In some examples, an embedded semiconductor package 100 can include a first dielectric layer 122 adjacent to one side of the core panel 106 and proximate the electrode 120. A first RDL 112 can be disposed within the first dielectric layer 122. For example, the first RDL 112 can be manufactured in a multi-step process wherein a first layer of dielectric material is deposited adjacent to the core panel 106, a first wiring pattern 124 is then patterned on the first layer of dielectric material to create the first RDL 112, for example by photolithography. A second layer of dielectric material can then be deposited on top of the first wiring pattern 124 to encapsulate the first RDL 112 within the first dielectric layer 122. The material for the wiring pattern 124 that makes up the first RDL 112 can include, but is not limited to, copper, gold, silver, aluminum, nickel, tin, or any combination (e.g., alloys) thereof. The first wiring pattern 124 can extend through the first dielectric layer 122 to create electrical connections 126 for the one or more electrodes 120.

In some examples, the first wiring pattern 124 can extend through the first dielectric layer 122, as shown in FIG. 1, to provide an external connection 128 for additional components, including but not limited to antennas, other I/O devices, and/or surface mounted semiconductor chips (e.g., memory chips, central processing units, graphical processing units, logic chips, etc.).

In some examples, an embedded semiconductor package 100 can include a second dielectric layer 130 adjacent to the molding compound layer 102. A second RDL 114 can be disposed within the second dielectric layer 130. For example, the second RDL 114 can be manufactured in a similar multi-step process as described above, wherein a second wiring pattern 132 is disposed within the second dielectric layer 130 to create the second RDL 114. In some examples, the second RDL 114 can be in electrical communication with the first RDL 112. This electrical communication can be facilitated by the via 116 disposed within the through aperture 110, wherein a first end of the via 116 is connected to the first RDL 112 and a second end of the via 116 is connected to the second RDL 114. In this manner, the second RDL 114 can be in electrical communication with the electrodes 120 of the semiconductor chip 108. It is contemplated that the material used for the second wiring pattern 132 can be similar to the materials described above for the first wiring pattern 124.

In some examples, the second wiring pattern 132 can extend through the second dielectric layer 130, as shown in FIG. 1, to provide a connection to electrical contacts, for example solder balls 134 or surface-mounted chips (which will be described in greater detail herein). The solder balls 134 can allow the embedded semiconductor package 100 to be mounted, for example, to a PCB.

Referring again to the core panel 106, it is contemplated that the core panel can be manufactured from a variety of materials. As described above, the ability to tailor the CTE of the core panel can reduce the die shift and warpage problems associated with epoxy-only WLFO architectures. If the material of the semiconductor chip 108 (die) has a CTE of approximately 3 ppm/° C., for example, and the molding compound layer 102 has a CTE of approximately 5-15 ppm/° C., the mismatch between the two layers can cause significant warpage to the package as the semiconductor chip 108 heats during use. In many cases, the PCB on which the package is mounted may have an even higher CTE, for example approximately 18 ppm/° C., further causing a heat-expansion problem for the system. The core panel 106 can provide a platform to decrease the warpage by allowing a manufacturer to tailor the CTE of the core panel 106 to counteract the various rates of expansion of the components. For example, the core panel 106 can be tailored to have a CTE close to that of the silicon die, close to that of the PCB, or to somewhere in between the two components, depending on the application.

It is contemplated that the core panel 106 can comprise an organic laminate material or an inorganic laminate material. For example, polyimide can be used as a material for a core layer 106. Polyimide can be tailored to have a CTE of from approximately 6 ppm/° C. to approximately 10 ppm/° C. Using this or other organic laminate materials could allow the core layer 106 to be tailored to have a CTE in a range between that of the die and the PCB. Inorganic materials can also be used to vary the core panel 106 CTE. Ceramics, for example, can have CTE ranges from about 3 ppm/° C. to about 6 ppm/° C., which lies closer to the CTE value of the die rather than to that of the PCB. Metals, on the other hand, can have CTE values of greater than 18 ppm/° C., which is closer to that of the PCB. A core panel 106 can comprise quartz, which can have a CTE of less than 1.00 ppm/° C., which can therefore expand very little as the semiconductor chip 108 heats during use.

In a preferred embodiment, the core panel 106 can comprise glass. Glass can provide many benefits not found in existing epoxy-mold-based WLFO technologies. The smooth surface and high-dimensional stability of glass enables high-density, silicon-like RDL wiring and BEOL-like I/Os even on large panels, thus increasing the productivity not possible in mold-compound based fan-out. The CTE of glass can be tailored, thus improving reliability and enabling the direct surface mounting onto the board unlike some high-density fan-out packages that require an organic package to connect to the board for large body sizes. Glass can be tailored to have CTE values from approximately 3 ppm/° C. to approximately 12 ppm/° C. (e.g., 3 ppm/° C.; from approximately 3 ppm/° C. to approximately 5 ppm/° C.; from approximately 5 ppm/° C. to approximately 7 ppm/° C.; from approximately 7 ppm/° C. to approximately 9 ppm/° C.; or from approximately 9 ppm/° C. to approximately 12 ppm/° C.). In addition to these CTE-benefits for the core panel 106, glass also has around two to three times lower loss-tangent as compared to molding compound 118. Glass also provides high resistivity, excellent moisture resistance, and high surface smoothness as compared to molding compounds 118. As described above, the thickness of the core panel 106 can vary according to the needs of the design, e.g., the rigidity of the layer. Because glass also provides excellent rigidity, it is contemplated that glass core panels 106 can be thin, including for example less than 100 µm (e.g., from 10 µm to 50 µm; or from 50 µm to 100 µm). This thinness can allow for a more compact package while maintaining sufficient handing integrity. A glass core panel 106 can also be manufactured to have any other thickness described herein for a core panel 106.

It is contemplated that another layer of core-panel material is not positioned above or below the semiconductor chip 108, because this can cause heat shielding. In other words, as the semiconductor chip 108 heats during use, the heat may not be able to escape from the chip aperture 104 if another panel is positioned above or below the chip aperture 104. This is particularly true when the panels comprise glass, which is a good insulator. The heat shielding caused by the additional panel could further add to the warpage problem found in previous packages. Therefore, it is contemplated that the core panel 106 does not extend over the semiconductor chip 108, and it is also contemplated that the embedded semiconductor package 100 does not include an additional panel similar to core panel 106 either above or below (e.g., parallel) to the core panel 106 that covers a portion of the semiconductor chip 108.

FIG. 2 is a schematic cross sectional view of an embedded semiconductor package 100 without a molding compound layer, according to some embodiments of the present disclosure. FIG. 2 is similar to the construct found in FIG. 1, but the embedded semiconductor package 100 in FIG. 2 does not have the molding compound layer 102 or molding compound 118. As described above, some examples of the present disclosure include examples of embedded semiconductor packages 100 that do not include a molding compound layer 102. In some examples, the molding compound can be used to manufacture the embedded semiconductor package 100 and can be removed prior to depositing a layer of dielectric material. Referring to FIG. 1 for illustration, the molding compound 118 in FIG. 1 can be used to manufacture the structure but can be removed during the manufacturing process. The first dielectric layer 122, for example, can be applied, the molding compound 118 can be removed, and the second dielectric layer 130 can be added. In this example, the dielectric material of the second dielectric layer 130 can extend into the chip aperture 104 to encapsulate the semiconductor chip 108.

This construct without the molding compound 118 can be used to further tailor the CTE of the entire embedded semiconductor package 100. As described above, the mismatch of CTE values for the various components of embedded semiconductor packages 100 can cause warpage to the overall package. The molding compound 118 used to manufacture embedded semiconductor packages 100 can have a CTE of approximately 10-12 ppm/° C. The semiconductor chip 108 can have a CTE of approximately 3 ppm/° C. By removing the molding compound layer 102 from the final product, the core panel 106 can be tailored to have a CTE closer to the semiconductor chip 108 (e.g., closer to 3 ppm/° C.), and a mismatch between the molding compound layer 102, the semiconductor chip 108, and the core panel 106 can be obviated.

FIG. 3 is a schematic cross sectional view of an embedded semiconductor package 100 with a semiconductor chip 108 adhered to a planar molding compound layer 102, according to some embodiments of the present disclosure. The embedded semiconductor package 100 in FIG. 3 is similar to the embedded semiconductor package 100 shown in FIG. 1 with an alternative method of attaching the semiconductor chip 108 to the molding compound layer 102. FIG. 1, for example, depicts a package wherein the molding compound 118 extends at least partially into the chip aperture 104 to secure the semiconductor chip 108 by encapsulation (or at least partial encapsulation). FIG. 3 depicts an embedded semiconductor package 100 wherein the molding compound layer 102 is planar and does not extend into the chip aperture 104. The semiconductor chip 108 is attached to the molding compound layer 102 via an adhesive 302. In some examples, the adhesive 302 can include a die attach film.

In some examples, and as shown in FIG. 3, when a molding compound layer 102 does not extend into the chip aperture 104, the dielectric material of the first dielectric layer 122 can extend into the chip aperture 104 to encapsulate the semiconductor chip 108 and the one or more electrodes 120. In some examples, the embedded semiconductor package 100 can include a passivation layer 121 at the location of the one or more electrodes 120, as described above.

FIG. 4 is a schematic cross sectional view of an embedded semiconductor package 100 without a molding compound layer, according to some embodiments of the present disclosure. FIG. 4 is similar to the construct found in FIG. 3, but the embedded semiconductor package 100 in FIG. 4 does not have the molding compound layer 102 or molding compound 118. As described above, some examples of the present disclosure include examples of embedded semiconductor packages 100 that do not include a molding compound layer 102. Such an example is described above with reference to FIG. 2, and the same description therein can apply to the construct shown in FIG. 4. In some examples, the molding compound can be used to manufacture the embedded semiconductor package 100 and can be removed prior to depositing a layer of dielectric material. Referring to FIG. 3 for illustration, the molding compound 118 in FIG. 3 can be used to manufacture the structure but can be removed during the manufacturing process. The molding compound layer 102, for example, can be provided to help position the core panel 106 and semiconductor chip 108. A first dielectric layer 122 can be applied, and the dielectric material of the first dielectric layer 122 can extend into the chip aperture 104 to encapsulate the semiconductor chip 108. The molding compound 118 can be removed, and a second dielectric layer 130 can be applied where the molding compound layer 102 was removed.

FIG. 5 is a schematic cross sectional view of an embedded semiconductor package 100 with a plurality of semiconductor chips 108,502, according to some embodiments of the present disclosure. In some examples, an embedded semiconductor package 100 can include a plurality of semiconductor chips 108,502. For example, a first semiconductor chip 108 can be disposed in a first chip aperture 104, and a second semiconductor chip 502 can be disposed in a second chip aperture 504. This architecture enables different types of chips to be embedded within the same core panel 106. For example, in a single package, one semiconductor chip 108,502 can include, but is not limited to, one of a memory chip, a central processing unit, a graphical processing unit, a logic chip, or an integrated passive device, and another semiconductor chip 502,108 can include another of those units. In some examples, instead of a having a separate aperture to house a second chip, two semiconductor chips 108,502 can be placed adjacent to each other within a single aperture. Furthermore, although FIG. 5 depicts an embodiment with two chips 108,502 and two apertures 104,504, the designs described herein are not limited to two chips and/or two chip apertures.

In some examples, the two chips 108,502 can share a single first RDL 112a,b and/or share a single second RDL 114a,b. In other words, both the first semiconductor chip 108 and the second semiconductor chip 502 can be in electrical communication with one another by shared RDLs. For example, one or more electrodes 120 of the first semiconductor chip 108 can be in electrical communication with one or more electrodes 506 of the second semiconductor chip 502 via a shared first RDL 112a,b. The shared first RDL 112a,b can also be in electrical communication with a shared second RDL 114a,b, for example by a first via 116. In other examples, the two chips 108,502 can have independent RDLs. In other words, the first semiconductor chip 108 may not be in electrical communication with the second semiconductor chip 502. The second semiconductor chip 502 can be connected to a third wiring pattern 508 in the first RDL 112b, for example. The third wiring pattern 508 can be in electrical communication with a fourth wiring pattern 510 in the second RDL 112b, for example by means of a second via 512. The second via 512, which can be similar to the via 116 described with reference to FIG. 1, can pass through a second through aperture 514 extending through the core panel 106.

As shown in FIG. 5, in some examples, a first RDL 112a,b can be disposed at the surface of the first dielectric layer 122 instead of being embedded in the layer. Similarly, a second RDL 114a,b, can be disposed at the surface of the second dielectric layer 130 instead of being embedded in the layer. This architecture is possible in any of the examples described herein. In other examples, and a shown in FIGS. 1 and 3, the RDLs can be disposed within their respective dielectric layers 122,130.

FIG. 5 depicts an embedded semiconductor package 100 where two semiconductor chips 108,502 are embedded within molding compound 118, similar to the example described in the discussion for FIG. 1. A multi-chip construct is not limited, however, to chips embedded within the molding compound 118. In other examples, the semiconductor chips 108,502 can be attached to a planar molding compound layer 102 like shown in FIG. 3, for example by an adhesive 302. It is also contemplated that some semiconductor chips are embedded in molding compound 118 while other semiconductor chips are attached to the molding compound layer 102 via an adhesive 302, i.e., both attachment techniques can be provided in a single embedded semiconductor package 100.

Figure 6:
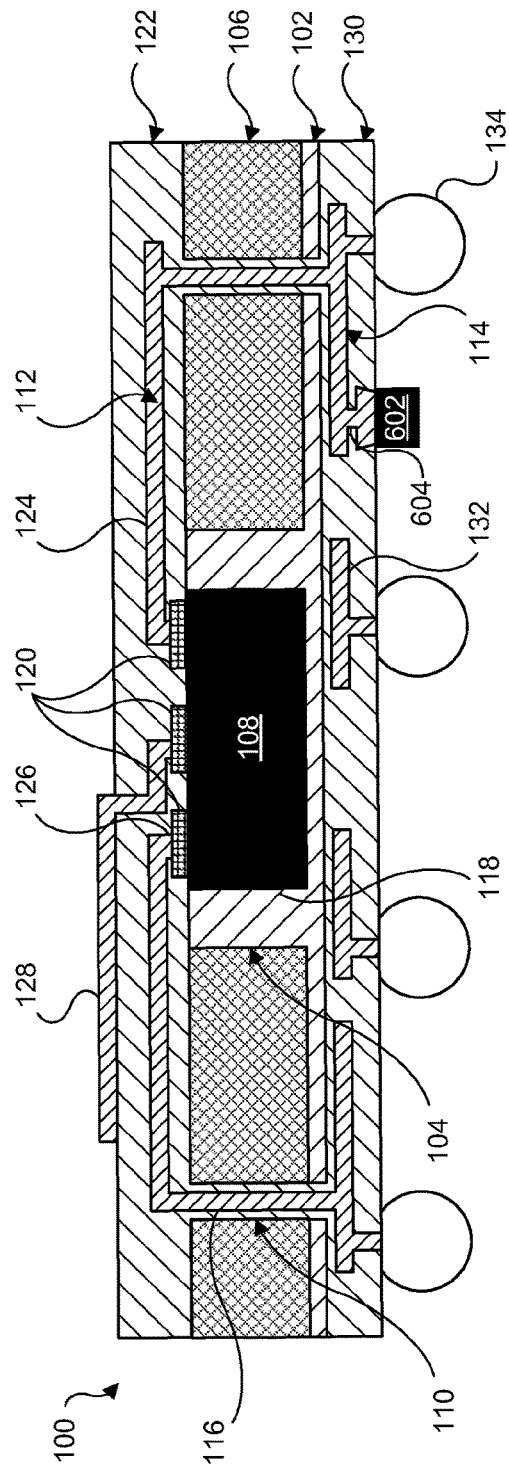
FIG. 6 is a schematic cross sectional view of an embedded semiconductor package with a surface-mounted semiconductor chip, according to some embodiments of the present disclosure.

FIG. 6 is a schematic cross sectional view of an embedded semiconductor package 100 with a surface-mounted semiconductor chip 602, according to some embodiments of the present disclosure. The present systems and methods enable additional semiconductor chips (e.g., memory chips, central processing units, graphical processing units, logic chips, etc.) to be positioned outside of the one or more chip apertures 104. In one example, the additional semiconductor chip can be surface-mounted to either the first dielectric layer 122 or the second dielectric layer 130. For example, the surface-mounted semiconductor chip 602 shown in FIG. 6 is mounted to the second dielectric layer 130 and is connected to the second RDL 114 via an electrical connection 604 (which is similar to electrical connection 126) extending through the second dielectric layer 130. This example enables the surface-mounted semiconductor chip 602 to be placed between the solder balls 134 and therefore preserves spaces. In other examples, the surface-mounted semiconductor chip 602 can be mounted to the first dielectric layer 122, and the surface-mounted semiconductor chip 602 can be connected to the first RDL 112 via the electrical connection 126. In some examples, the embedded semiconductor package can include more than one surface-mounted semiconductor chip 602 mounted to the first dielectric layer 122 and/or more than one surface-mounted semiconductor chip 602 mounted to the second dielectric layer 122.

Figure 7A:
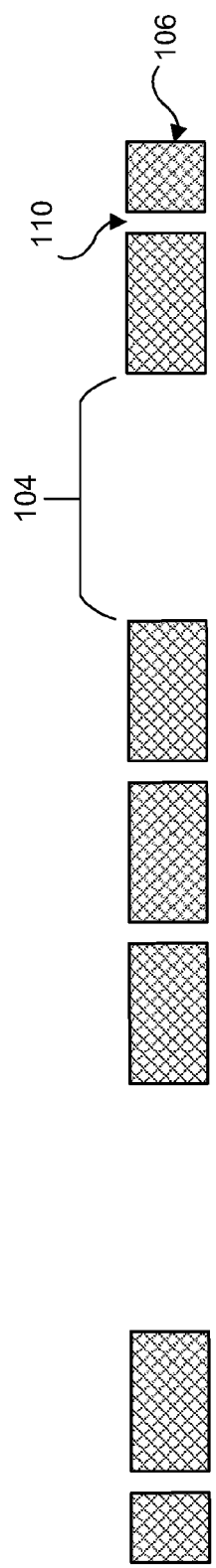
Figure 7B:
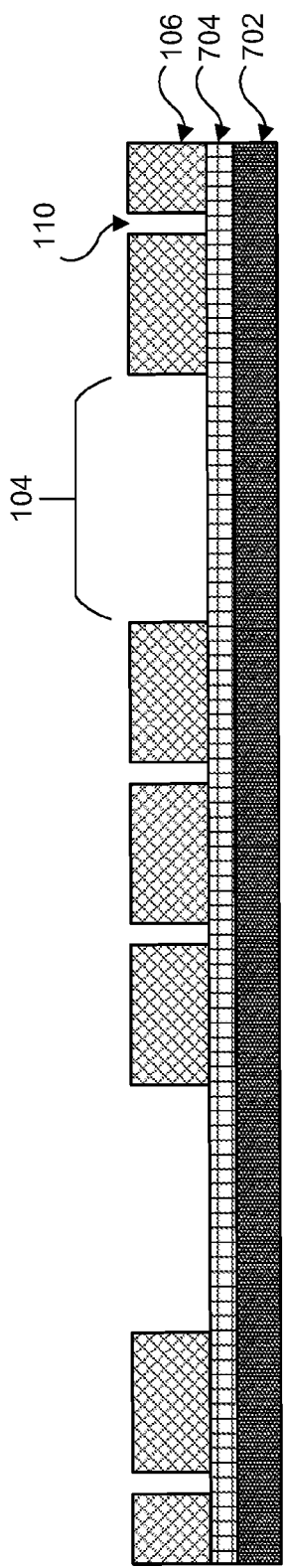
Figure 7C:
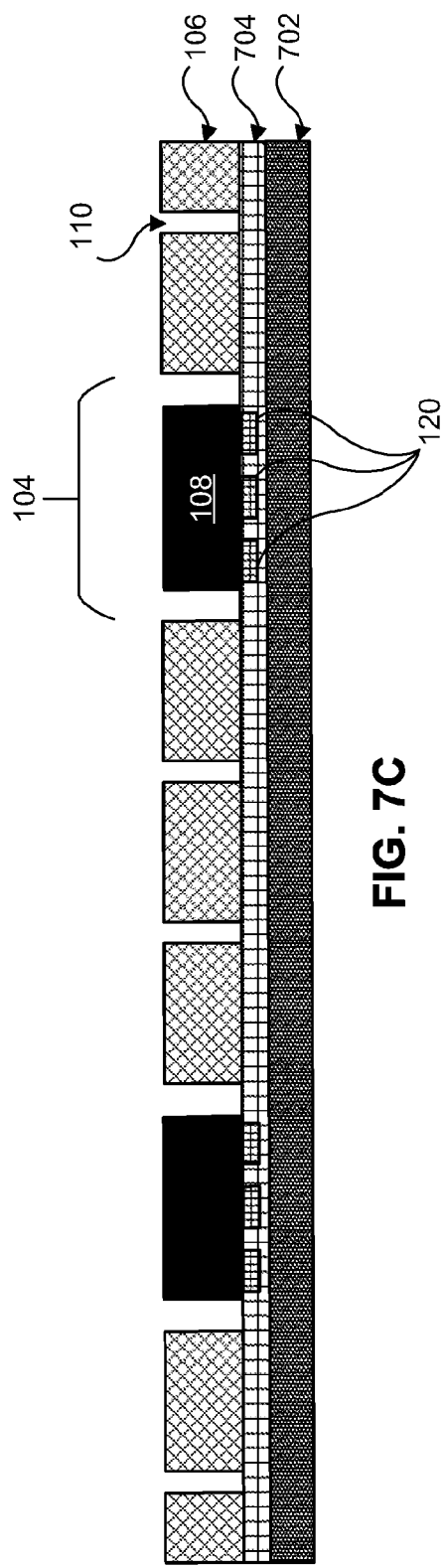

FIGS. 7A-7K depict an exemplary process for manufacturing an embedded semiconductor package, according to some embodiments of the present disclosure. FIGS. 7A-7K depict a process that can manufacture an embedded semiconductor package 100 similar to the exemplary embodiment shown in FIG. 1. FIGS. 7A-7K show multiple packages side by side, as the present systems and methods enables the production of multiple units on a sheet that can be subsequently diced. Only the right package in FIGS. 7A-7K is labeled with reference numbers, and the left package is not labeled so as to provide a view of the various components. As can be seen in FIG. 7A, in some examples, a core panel 106 can be prepared. The various apertures, for example the chip apertures 104 and through apertures 110 can be made by drilling the apertures within the core panel 106. In FIG. 7B, the core panel 106 can be laminated to a carrier layer 702 via an adhesive 704. The carrier layer 702 can be manufactured of a material capable of providing support to the core panel 106 during processing and transport, and the materials can include any of the materials described above for the core panel 106 itself (e.g., glass, metallic materials, etc.). In FIG. 7C, a semiconductor chip 108 can be placed into a chip aperture 104, with the one or more electrodes 120 placed facing the carrier layer 702. In FIG. 7D, a molding compound 118 can be applied to the top of the construct to form the molding compound layer 102. The molding compound 118 can be applied to the top of the construct by pouring an epoxy or other polymer on the top of the core panel 106. In the embodiment shown in FIG. 7D, the molding compound 118 is able to extend into the chip aperture 104 to at least partially encapsulate the semiconductor chip 108.

The molding compound 118 can then be cured. It is contemplated that the curing process can be completed in a single-step process or a multi-step process. As described above, a preferred manufacturing process for an embedded semiconductor can limit die shift and warpage. Dies embedded in epoxies can shift when the epoxies around the dies shrink during the curing process. Additionally, previous methods including only epoxy layers may experience significant warpage during the curing process. This can result in a drop in the yield due to misalignments, for example. The curing process can be tailored to decrease die shift and/or warpage. In one example, the molding compound 118 can be cured at a single temperature, i.e., a traditional curing temperature profile. In other examples, the curing can be completed in a two-step process. In the first step of the curing process, the molding compound 118 can be cured first at a low temperature, where the epoxy remains viscous, for a prolonged duration. In the second step of the curing process, the temperature can be increased to the traditional curing temperature profile. In experiments testing the single-step curing profile and the multi-step curing profile on an example semiconductor package, it was found that the die shift can be reduced by using the two-step curing profile.

Figure 7G:
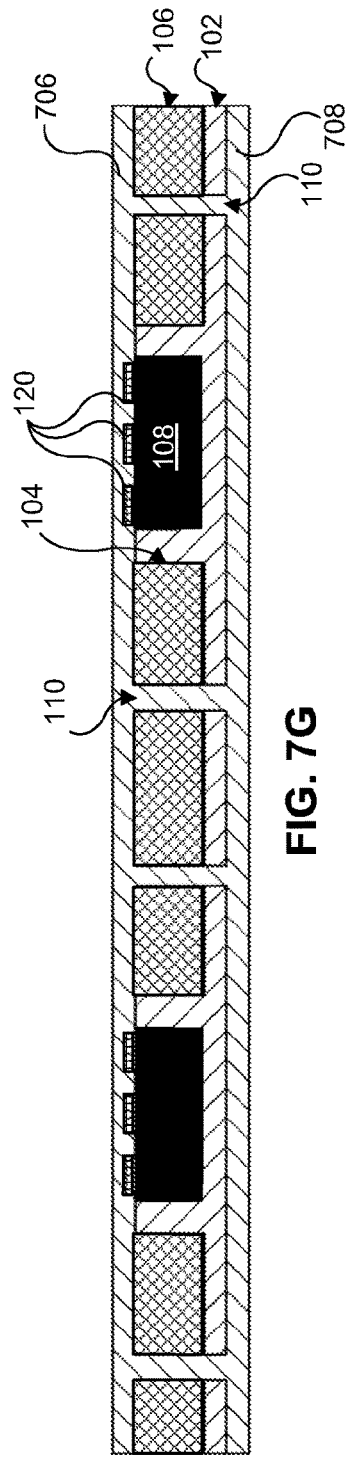

In FIG. 7E, the carrier layer 702 and adhesive 704 can be removed from the construct once the molding compound 118 is cured. In FIG. 7F, the through apertures 110 can be reopened by re-drilling the openings. This reopening of the through apertures 110 can be beneficial to reopen the apertures 110 if the molding compound 118 has extended into the aperture (see for example FIG. 7D). In FIG. 7G, a first layer of dielectric material 706 can be applied to the core panel 106 and a second layer of dielectric material 708 can be applied to the molding compound layer 102. In some examples, once the layers of dielectric materials 706,708 have been applied, the surface of the layers can be planarized to avoid non-coplanarities that may arise from the dielectric materials filling up the various apertures.

In an alternative example that is not shown, the first layer of dielectric material 706 can be applied and then the molding compound 118 can be removed. The second layer of dielectric material 706 can then be added and can extend into the chip aperture 104. This alternative embodiment can make the embedded semiconductor package 100 shown in FIG. 2.

Figure 7H:
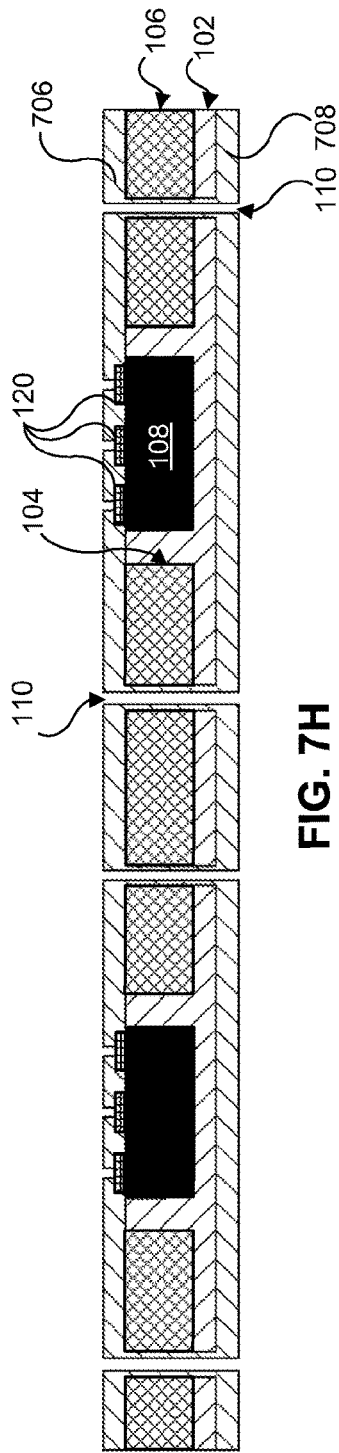

In FIG. 7H, the through apertures 110 can be reopened by drilling through the dielectric material. As shown in the figure, the reopened through aperture 110 can include a layer of dielectric material disposed between the opening and the core panel 106, which can allow the dielectric material to surround the vias.

Figure 7I:
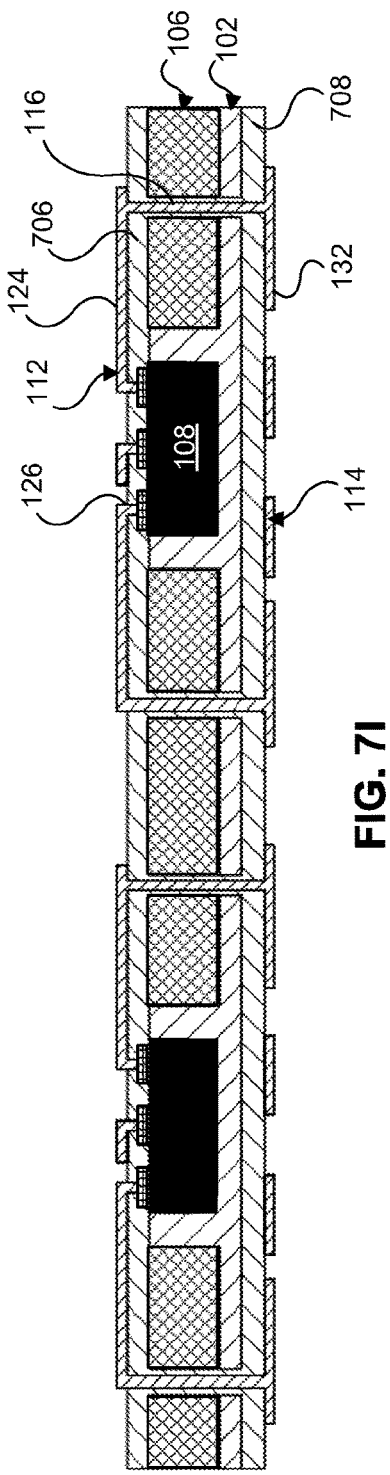

In FIG. 7I, a first RDL 112 and/or second RDL 114 can be formed on the first layer of dielectric material 706 and/or the second layer of dielectric material 708, respectively. The RDLs 112,114 can be made, for example, using standard semi-additive processes (SAP). Electro-less deposition of copper can be used to form a seed layer on the first layer of dielectric material 706 and/or second layer of dielectric material 708. This process can also metalize the walls of the through apertures 110 to create the vias 116 for connecting the first RDL 112 with the second RDL 114. After the copper deposition, the wiring patterns 124,132 can be created via photolithography, and copper can be deposited through electrolytic plating. The photoresist can be stripped off and the copper seed layer can be differentially etched to form the first RDL 112 and/or second RDL 114.

Figure 7J:
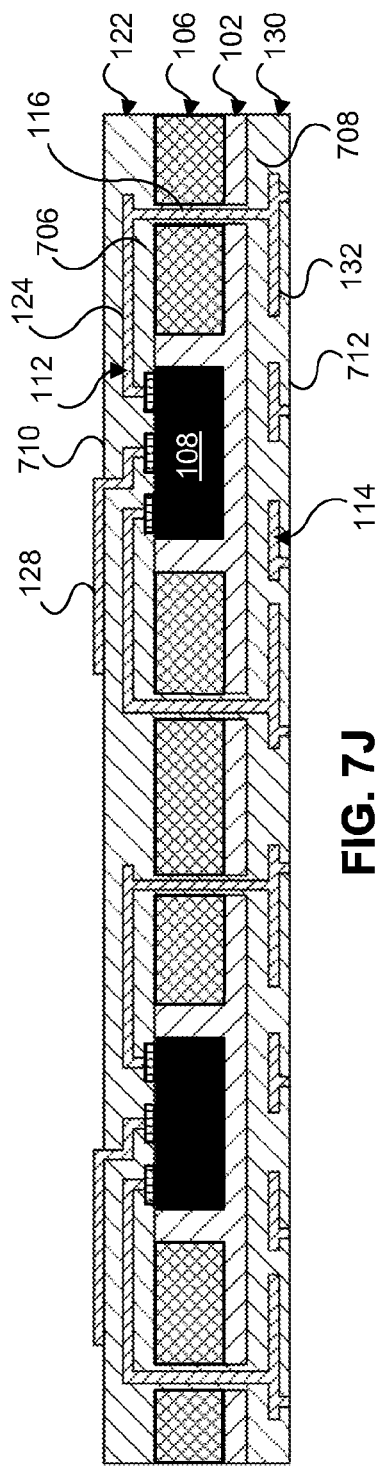
Figure 7K:
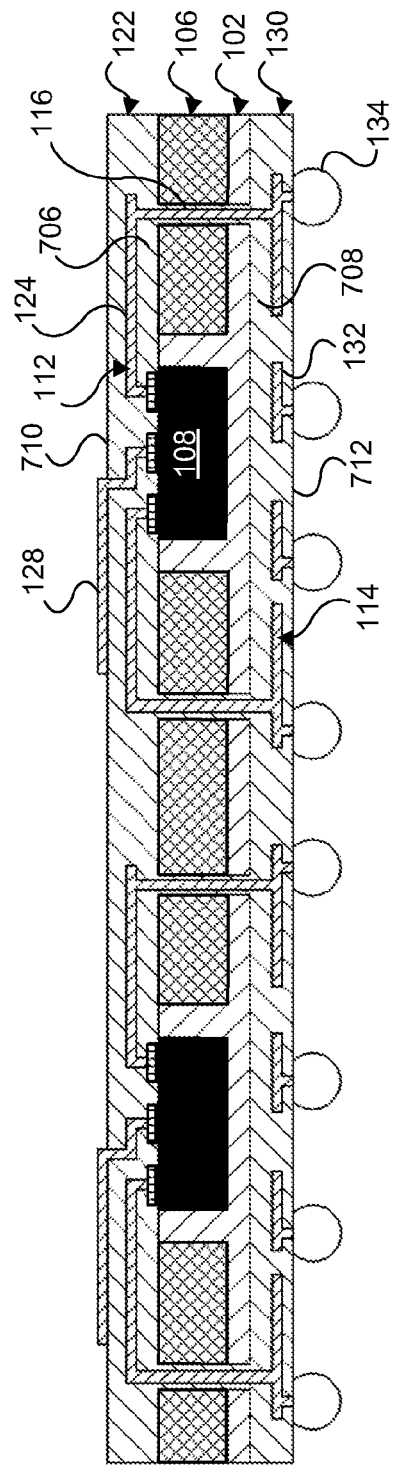

In FIG. 7J, a third layer of dielectric material 710 and/or fourth layer of dielectric material 712 can be deposited on top of the first RDL 112 and/or second RDL 114. By depositing another layer of dielectric material 710,712 on the RDLs, each RDL can be disposed within the material. For example, a first RDL 112 can be disposed within the first dielectric layer 122 and the second RDL 114 can be disposed within the second dielectric layer 130. Also, as described above, the first wiring pattern 124 can extend through the first dielectric layer 122 to provide an external connection 128 for additional components. The external connection 128 can be disposed on the outer surface of the first dielectric layer 122. Similarly, the second wiring pattern 132 can extend through the second dielectric layer 130 to connect external devices. For example, and as shown in FIG. 7K, solder balls 134 or similar electrical contacts can be added to the package to connect to a PCB.

Figure 8A:
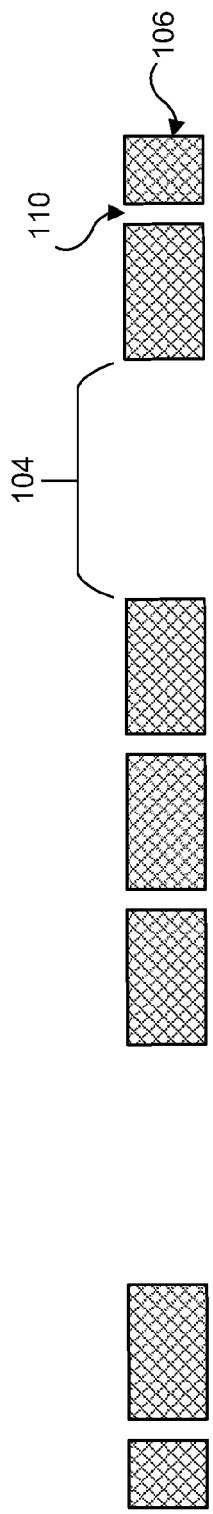
Figure 8B:
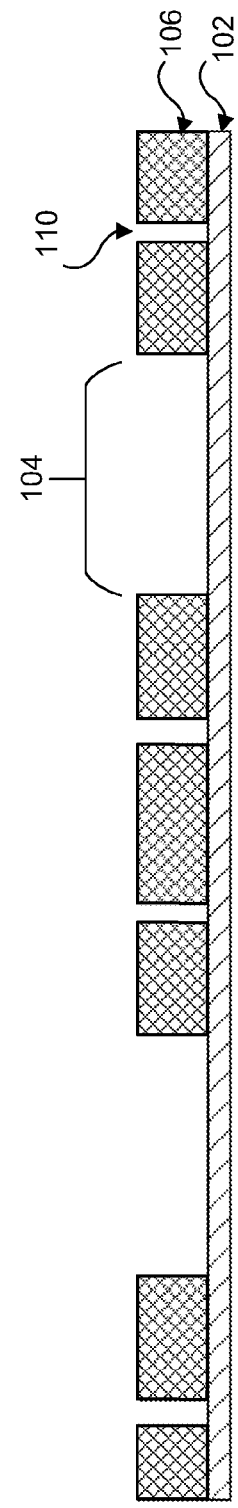

FIGS. 8A-8H depict an exemplary process for manufacturing an embedded semiconductor package, according to some embodiments of the present disclosure. FIGS. 8A-8H depict an exemplary process for manufacturing an embedded semiconductor package 100 with a semiconductor chip 108 adhered to a planar molding compound layer 102, as shown and described with reference to FIG. 3. FIGS. 8A-8H show multiple packages side by side, as the present systems and methods enables the production of multiple units on a sheet that can be subsequently diced. Only the right package in FIGS. 8A-8H is labeled with reference numbers, and the left package is not labeled so as to provide a view of the various components. As can be seen in FIG. 8A, in some examples, a core panel 106 can be prepared. The various apertures, for example the chip apertures 104 and through apertures 110 can be made by drilling the apertures within the core panel 106. In FIG. 8B, a layer of molding compound 118 can be prepared, for example by pouring the molding compound 118 upon a surface, thereby creating the molding compound layer 102. The core panel 106 can be placed upon the molding compound layer 102. The molding compound 118 can then be cured. The curing of the molding compound 118 and molding compound layer 102 can be completed in a single-step process or a multi-step process, similar to the curing profiles described with reference to FIG. 7D.

Figure 8C:
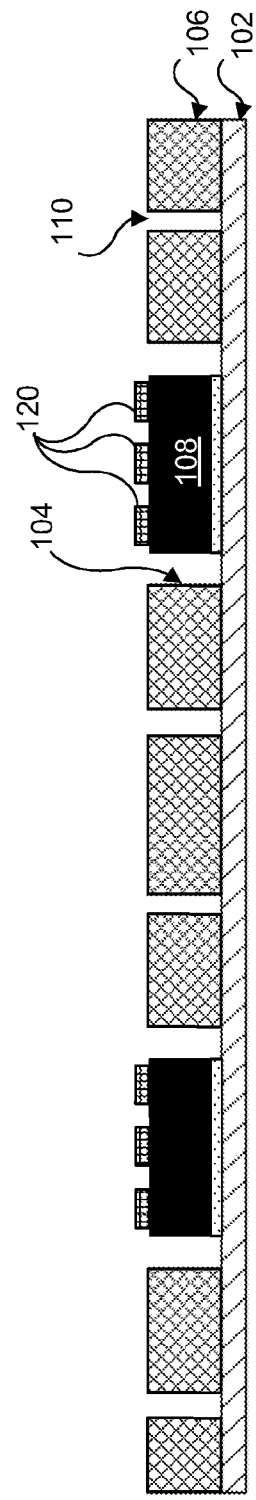
Figure 8D:
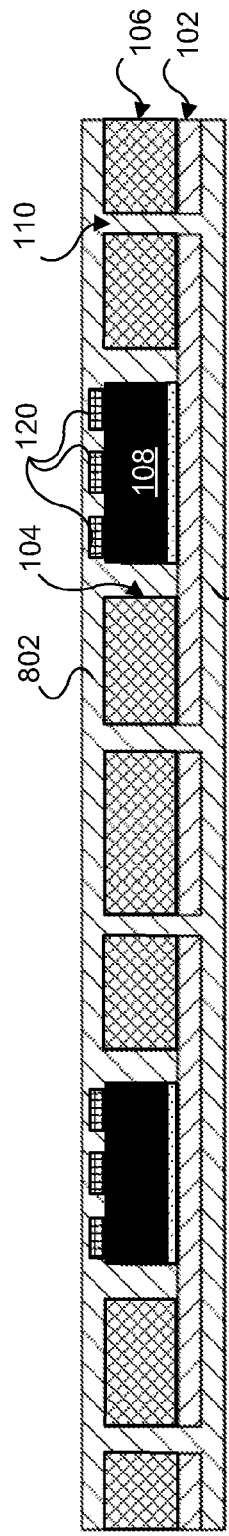

In FIG. 8C, a semiconductor chip 108 can be placed into a chip aperture 104. In this process, the semiconductor chip 108 is not embedded within the molding compound 118. The semiconductor chip 108 can be attached to the molding compound layer 102 by using an adhesive 302, including but not limited to a die attach film. In FIG. 8D, a first layer of dielectric material 802 can be applied to the core panel 106 and a second layer of dielectric material 804 can be applied to the molding compound layer 102. In some examples, once the layers of dielectric materials 802,804 have been applied, the surface of the layers can be planarized to avoid non-coplanarities that may arise from the dielectric materials filling up the various apertures.

In an alternative example that is not shown, the first layer of dielectric material 802 can be applied, and the first layer of dielectric material 802 can extend into the chip aperture 104 to encapsulate the semiconductor chip 108. The molding compound 118 can then be removed. The second layer of dielectric material 804 can then be applied where the molding compound 118 was removed. This alternative embodiment can make the embedded semiconductor package 100 shown in FIG. 4.

Figure 8E:
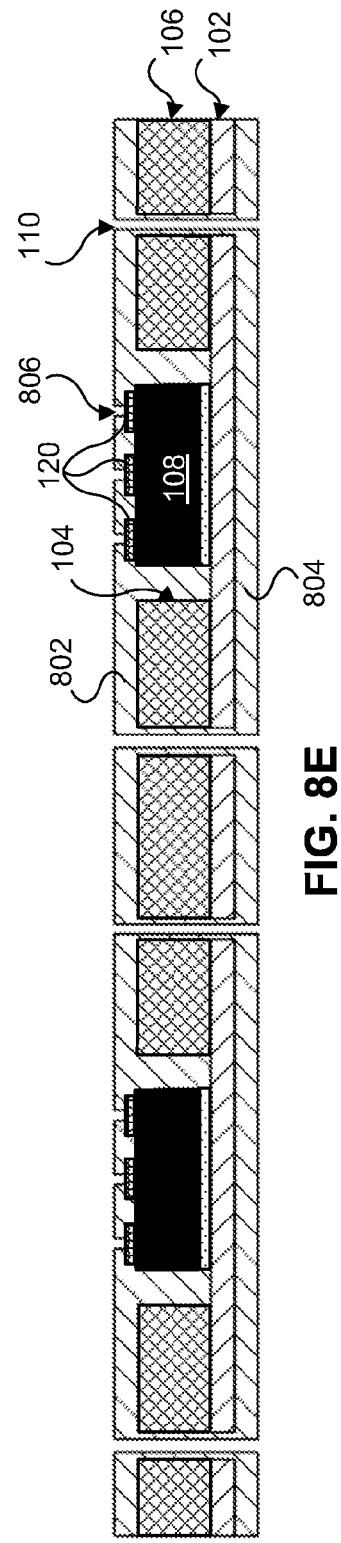

In FIG. 8E, the through apertures 110 can be reopened by drilling through the dielectric material. As shown in the figure, a reopened through aperture 110 can include a layer of dielectric material disposed between the opening and the core panel 106, which can allow the dielectric material to surround the vias. Additional electrode-connection openings 806 can be drilled to expose the tops of the electrodes 120.

Figure 8F:
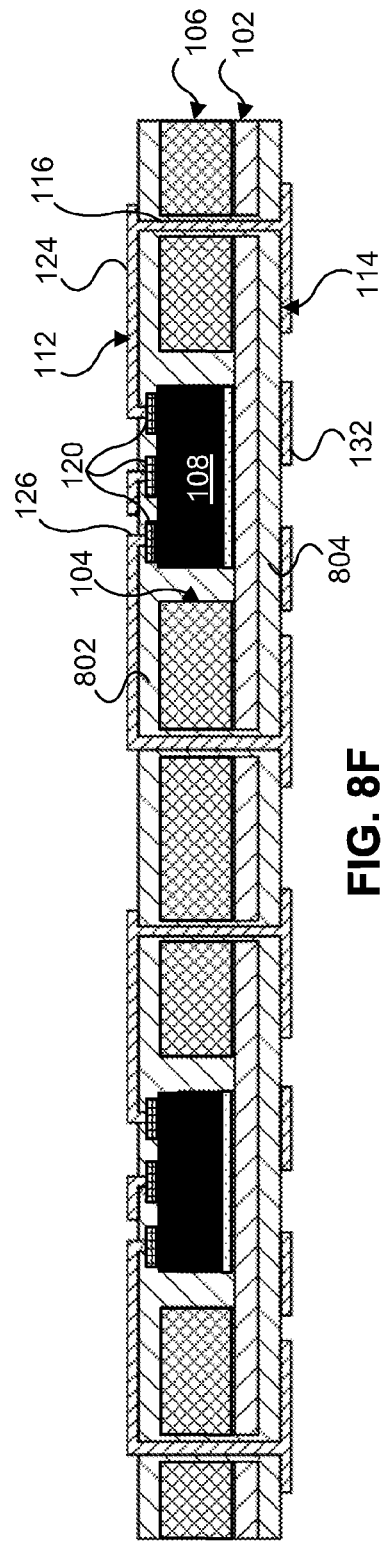

In FIG. 8F, a first RDL 112 and/or second RDL 114 can be formed on the first layer of dielectric material 802 and/or the second layer of dielectric material 804. The processes of forming the wiring patterns 124,132 of the RDLs 112,114 can be similar to that described above for FIG. 7I. In addition, the electro-less deposition of copper can also metalize the electrode-connection openings 806 to create an electrical connection 126 between the one or more electrodes 120 and the first RDL 112.

In FIG. 8G, a third layer of dielectric material 808 and/or fourth layer of dielectric material 810 can be deposited on top of the first RDL 112 and/or second RDL 114. By depositing another layer of dielectric material 808,810 on the RDLs, each RDL can be disposed within the material. For example, a first RDL 112 can be disposed within the first dielectric layer 122 and the second RDL 114 can be disposed within the second dielectric layer 130. Also, and as described above, the first wiring pattern 124 can extend through the first dielectric layer 122 to provide an external connection 128 for additional components. The external connection 128 can be disposed on the outer surface of the first dielectric layer 122. Similarly, the second wiring pattern 132 can extend through the second dielectric layer 130 to connect external devices. For example, and as shown in FIG. 8H, solder balls 134 or similar electrical contacts can be added to the package to connect to a PCB.

Figure 9:
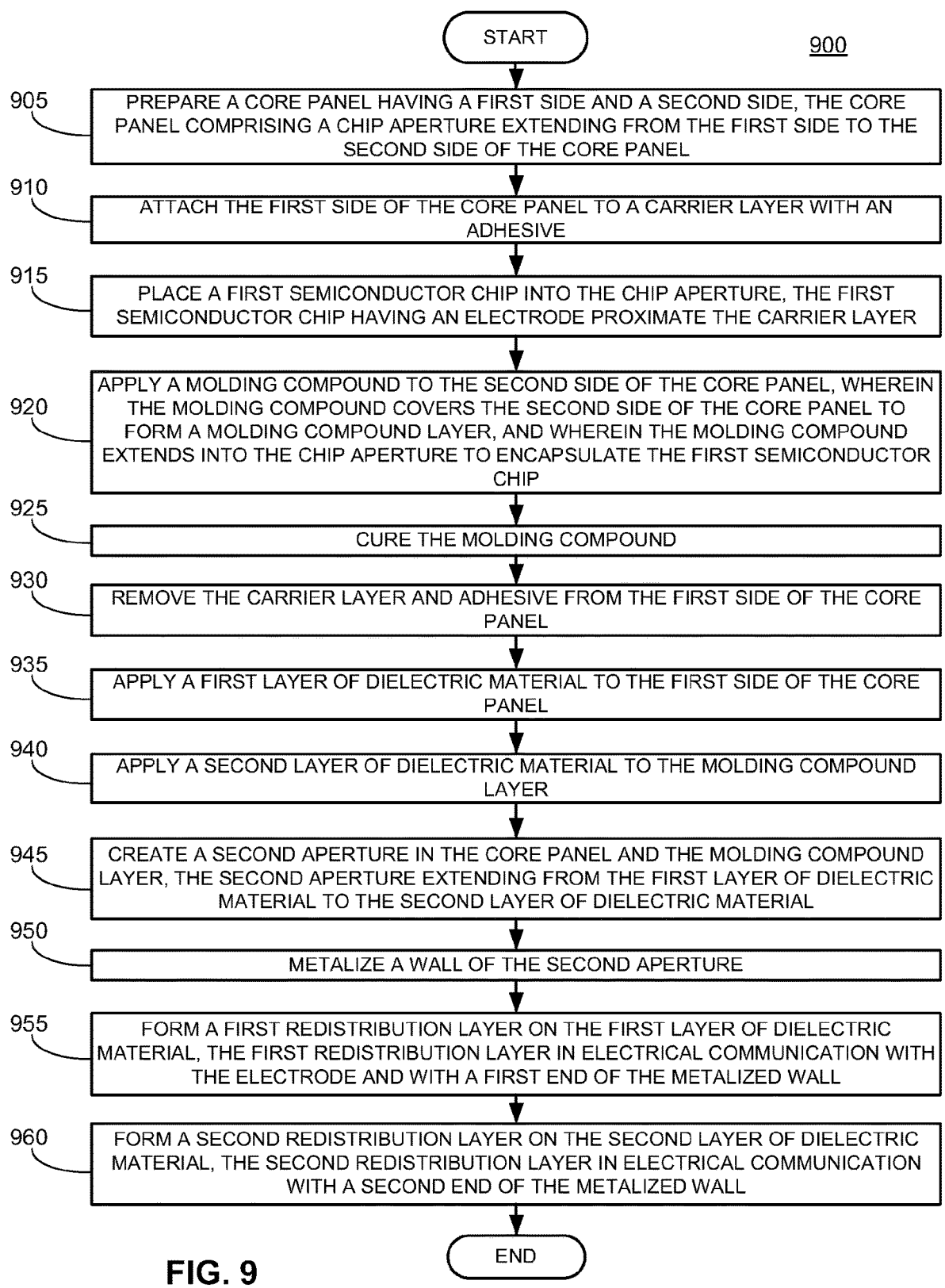
FIG. 9 is a flowchart of an exemplary method of manufacturing an embedded semiconductor package, according to some embodiments of the present disclosure.

FIG. 9 is a flowchart of an exemplary method 900 of manufacturing an embedded semiconductor package, according to some embodiments of the present disclosure. Method 900 can be used to manufacture an embedded semiconductor package like the one shown in FIG. 1. At block 905, method 900 includes preparing a core panel having a first side and a second side, the core panel comprising a chip aperture extending from the first side to the second side of the core panel. At block 910, method 900 includes attaching the first side of the core panel to a carrier layer with an adhesive. At block 915, method 900 includes placing a first semiconductor chip into the chip aperture, the first semiconductor chip having an electrode proximate the carrier layer. At block 920, method 900 includes applying a molding compound to the second side of the core panel, wherein the molding compound covers the second side of the core panel to form a molding compound layer, and wherein the molding compound extends into the chip aperture to encapsulate the first semiconductor chip. At block 925, method 900 includes curing the molding compound. At block 930, method 900 includes removing the carrier layer and the adhesive from the first side of the core panel. At block 935, method 900 includes applying a first layer of dielectric material to the first side of the core panel. At block 940, method 900 includes applying a second layer of dielectric material to the molding compound layer. At block 945, method 900 includes creating a second aperture in the core panel and the molding compound layer, the second aperture extending from the first layer of dielectric material to the second layer of dielectric material. At block 950, method 900 includes metalizing a wall of the second aperture. At block 955, method 900 includes forming a first redistribution layer on the first layer of dielectric material, the first redistribution layer in electrical communication with the electrode and with a first end of the metalized wall. At block 960, method 900 includes forming a second redistribution layer on the second layer of dielectric material, the second redistribution layer in electrical communication with a second end of the metalized wall.

Figure 10:
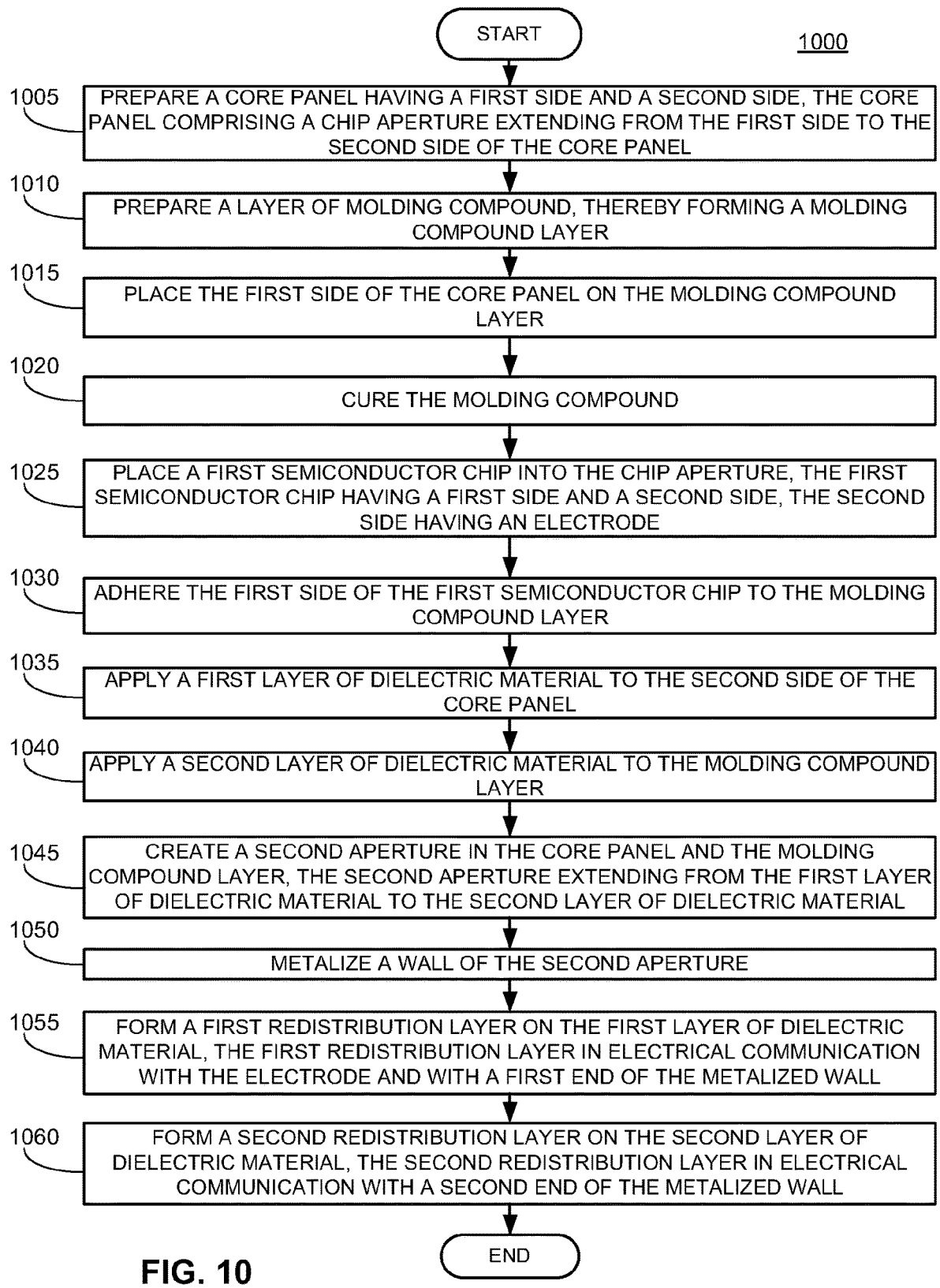
FIG. 10 is a flowchart of an exemplary method of manufacturing an embedded semiconductor package, according to some embodiments of the present disclosure.

FIG. 10 is a flowchart of an exemplary method 1000 of manufacturing an embedded semiconductor package, according to some embodiments of the present disclosure. Method 1000 can be used to manufacture an embedded semiconductor package like the one shown in FIG. 3. At block 1005, method 1000 includes preparing a core panel having a first side and a second side, the core panel comprising a chip aperture extending from the first side to the second side of the core panel. At block 1010, method 1000 includes preparing a layer of molding compound, thereby forming a molding compound layer. At block 1015, method 1000 includes placing the first side of the core panel on the molding compound layer. At block 1020, method 1000 includes curing the molding compound. At block 1025, method 1000 includes placing a first semiconductor chip into the chip aperture, the first semiconductor chip having a first side and a second side, the second side having an electrode. At block 1030, method 1000 includes adhering the first side of the first semiconductor chip to the molding compound layer. At block 1035, method 1000 includes applying a first layer of dielectric material to the second side of the core panel. At block 1040, method 1000 includes applying a second layer of dielectric material to the molding compound layer. At block 1045, method 1000 includes creating a second aperture in the core panel and the molding compound layer, the second aperture extending from the first layer of dielectric material to the second layer of dielectric material. At block 1050, method 1000 includes metalizing a wall of the second aperture. At block 1055, method 1000 includes forming a first redistribution layer on the first layer of dielectric material, the first redistribution layer in electrical communication with the electrode and with a first end of the metalized wall. At block 1060, method 1000 includes forming a second redistribution layer on the second layer of dielectric material, the second redistribution layer in electrical communication with a second end of the metalized wall.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. An embedded semiconductor package comprising:
 a core panel having a first side and a second side, wherein the core panel comprises:
  a first through aperture extending from the first side to the second side of the core panel;
  a second chip aperture extending from the first side to the second side of the core panel; and
  a third chip aperture extending from the first side to the second side of the core panel;
 a molding compound layer having a first side and a second side, wherein the first side is proximate the first side of the core panel and extends at least partially into the first chip aperture;
 a first semiconductor chip disposed in the first chip aperture and at least partially within the molding compound layer, wherein the first semiconductor chip has a first side proximate the molding compound layer and a second side opposite the molding compound layer and proximate the second side of the core panel, and wherein the second side of the first semiconductor chip has a first electrode;

a second semiconductor chip disposed in the third chip aperture and at least partially within the molding compound layer;
a first dielectric layer positioned proximate the second side of the core panel and proximate the first electrode;
a first redistribution layer disposed within the first dielectric layer and in electrical communication with the first electrode;
a second dielectric layer positioned proximate to and in contact with the second side of the molding compound layer; and
a second redistribution layer disposed within the second dielectric layer and in electrical communication with the first redistribution layer.

2. The embedded semiconductor package of claim 1 further comprising a conductive material having a first end in electrical communication with the first redistribution layer and a second end in electrical communication with the second redistribution layer;
wherein the conductive material extends through the second through aperture.

3. The embedded semiconductor package of claim 1, wherein the core panel comprises glass.

4. The embedded semiconductor package of claim 3, wherein the glass has a coefficient of thermal expansion of approximately 3 ppm/° C.

5. The embedded semiconductor package of claim 3, wherein the glass has a coefficient of thermal expansion of from approximately 3 ppm/° C. to approximately 7 ppm/° C.

6. The embedded semiconductor package of claim 3, wherein the glass has a coefficient of thermal expansion of from approximately 7 ppm/° C. to approximately 10 ppm/° C.

7. The embedded semiconductor package of claim 3, wherein the glass has a coefficient of thermal expansion of greater than 10 ppm/° C.

8. The embedded semiconductor package of claim 1, wherein the core panel comprises at least one of an organic laminate material or an inorganic laminate material.

9. The embedded semiconductor package of claim 1, wherein the core panel comprises at least one of quartz or a metallic material.

10. The embedded semiconductor package of claim 1, wherein the second semiconductor chip has a first side proximate the molding compound layer and a second side opposite the molding compound layer and proximate the second side of the core panel; and
wherein the second side of the second semiconductor chip has a second electrode.

11. The embedded semiconductor package of claim 1, wherein the core panel has a thickness of less than 100 μm.

12. The embedded semiconductor package of claim 1, wherein:
the core panel does not extend over the first semiconductor chip; and
the embedded semiconductor package does not include an additional core panel parallel to the core panel.

13. The embedded semiconductor package of claim 1, wherein the core panel has a coefficient of thermal expansion in a range between that of the first semiconductor chip and the molding compound layer.

14. An embedded semiconductor package comprising:
a core panel having a first side and a second side, the core panel comprising:
a first chip aperture extending from the first side to the second side of the core panel;
a second through aperture extending from the first side to the second side of the core panel; and
a third chip aperture extending from the first side to the second side of the core panel;
a molding compound layer having a first side and a second side, wherein the first side is proximate the first side of the core panel and does not extend into the first chip aperture;
a first semiconductor chip disposed in the first chip aperture, wherein the first semiconductor chip has a first side proximate the molding compound layer and a second side opposite the molding compound layer and proximate the second side of the core panel, and wherein the second side of the first semiconductor chip has a first electrode;
a second semiconductor chip disposed in the third chip aperture;
a first dielectric layer positioned proximate the second side of the core panel and proximate the first electrode;
a first redistribution layer disposed within the first dielectric layer and in electrical communication with the first electrode;
a second dielectric layer positioned proximate to and in contact with the second side of the molding compound layer; and
a second redistribution layer disposed within the second dielectric layer and in electrical communication with the first redistribution layer.

15. The embedded semiconductor package of claim 14, wherein the first side of the first semiconductor chip is at least partially embedded into the first side of the molding compound layer.

16. The embedded semiconductor package of claim 14, wherein the first side of the first semiconductor chip is laminated to the first side of the molding compound layer via an adhesive.

17. The embedded semiconductor package of claim 16, wherein the adhesive is a die attach film.

18. The embedded semiconductor package of claim 14 further comprising a conductive material having a first end in electrical communication with the first redistribution layer and a second end in electrical communication with the second redistribution layer;
wherein the conductive material extends through the second through aperture.

19. The embedded semiconductor package of claim 14, wherein the core panel comprises glass.

20. The embedded semiconductor package of claim 19, wherein the glass has a coefficient of thermal expansion of approximately 3 ppm/° C.

21. The embedded semiconductor package of claim 19, wherein the glass has a coefficient of thermal expansion of from approximately 3 ppm/° C. to approximately 7 ppm/° C.

22. The embedded semiconductor package of claim 19, wherein the glass has a coefficient of thermal expansion of from approximately 7 ppm/° C. to approximately 10 ppm/° C.

23. The embedded semiconductor package of claim 19, wherein the glass has a coefficient of thermal expansion of greater than 10 ppm/° C.

24. The embedded semiconductor package of claim 14, wherein the core panel comprises at least one of an organic laminate material or an inorganic laminate material.

25. The embedded semiconductor package of claim 14, wherein the core panel comprises at least one of quartz or a metallic material.

26. The embedded semiconductor package of claim 14, wherein the second semiconductor chip has a first side proximate the molding compound layer and a second side opposite the molding compound layer and proximate the second side of the core panel; and
   wherein the second side of the second semiconductor chip has a second electrode.

27. The embedded semiconductor package of claim 26, wherein the first side of the second semiconductor chip is at least partially embedded into the first side of the molding compound layer.

28. The embedded semiconductor package of claim 26, wherein the first side of the second semiconductor chip is laminated to the first side of the molding compound layer via an adhesive.

29. The embedded semiconductor package of claim 14, wherein the core panel has a thickness of less than 100 μm.

30. The embedded semiconductor package of claim 14, wherein:
   the core panel does not extend over the first semiconductor chip; and
   the embedded semiconductor package does not include an additional core panel parallel to the core panel.

31. The embedded semiconductor package of claim 14, wherein the core panel has a coefficient of thermal expansion in a range between that of the first semiconductor chip and the molding compound layer.

\* \* \* \* \*